United States Patent
Chaji et al.

(10) Patent No.: US 12,014,999 B2
(45) Date of Patent: Jun. 18, 2024

(54) INTEGRATION AND BONDING OF MICRO-DEVICES INTO SYSTEM SUBSTRATE

(71) Applicant: VueReal Inc., Waterloo (CA)

(72) Inventors: Gholamreza Chaji, Waterloo (CA); Bahareh Sadeghimakki, Kitchener (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 17/031,587

(22) Filed: Sep. 24, 2020

(65) Prior Publication Data

US 2021/0020593 A1 Jan. 21, 2021

Related U.S. Application Data

(63) Continuation of application No. 16/189,844, filed on Nov. 13, 2018, now Pat. No. 10,818,622.

(30) Foreign Application Priority Data

Nov. 14, 2017 (CA) .................................. CA 2985254

(51) Int. Cl.
*H01G 11/36* (2013.01)
*H01L 23/00* (2006.01)
(Continued)

(52) U.S. Cl.
CPC .............. *H01L 24/05* (2013.01); *H01L 24/03* (2013.01); *H01L 24/08* (2013.01); *H01L 24/27* (2013.01); *H01L 24/29* (2013.01); *H01L 24/32* (2013.01); *H01L 24/80* (2013.01); *H01L 24/83* (2013.01); *H01L 33/62* (2013.01); *H01L 2224/03614* (2013.01); *H01L 2224/0363* (2013.01); *H01L 2224/03632* (2013.01); *H01L 2224/04026* (2013.01); *H01L 2224/05557* (2013.01); *H01L 2224/05558* (2013.01); *H01L 2224/056* (2013.01); *H01L 2224/08225* (2013.01);
(Continued)

(58) Field of Classification Search
CPC ....................... H01L 24/05; H01L 2224/05557
See application file for complete search history.

(56) References Cited

U.S. PATENT DOCUMENTS 6,340,822 B1 * 1/2002 Brown ..................... H01L 24/13
257/E23.068
8,877,636 B1 * 11/2014 Hunter ............... G01N 33/0037
438/665
(Continued)

FOREIGN PATENT DOCUMENTS

| CN | 201780997 | 3/2011 |
| CN | 102723427 | 10/2012 |
| CN | 105453001 | 3/2016 |

*Primary Examiner* — Ali Naraghi
(74) *Attorney, Agent, or Firm* — NIXON PEABODY LLP

(57) ABSTRACT

This disclosure is related to integrating optoelectronics microdevices into a system substrate for efficient and durable electrical bonding between two substrates at low temperature. 2D nanostructures and 3D scaffolds may create interlocking structures for improved bonding properties. Addition of nanoparticles into the structure creates high surface area for better conduction. Application of curing agents before or after alignment of micro devices and receiving substrates further assists with formation of strong bonds.

18 Claims, 33 Drawing Sheets

(51) Int. Cl.
*H01L 33/62* (2010.01)
*H03H 3/00* (2006.01)

(52) U.S. Cl.
CPC ............ *H01L 2224/27614* (2013.01); *H01L 2224/27632* (2013.01); *H01L 2224/29005* (2013.01); *H01L 2224/29019* (2013.01); *H01L 2224/29078* (2013.01); *H01L 2224/29139* (2013.01); *H01L 2224/2919* (2013.01); *H01L 2224/29193* (2013.01); *H01L 2224/2929* (2013.01); *H01L 2224/29339* (2013.01); *H01L 2224/29355* (2013.01); *H01L 2224/29386* (2013.01); *H01L 2224/29393* (2013.01); *H01L 2224/29439* (2013.01); *H01L 2224/29499* (2013.01); *H01L 2224/2957* (2013.01); *H01L 2224/29609* (2013.01); *H01L 2224/29611* (2013.01); *H01L 2224/29639* (2013.01); *H01L 2224/32227* (2013.01); *H01L 2224/80805* (2013.01); *H01L 2224/80897* (2013.01); *H01L 2224/83193* (2013.01); *H01L 2224/83897* (2013.01); *H03H 3/00* (2013.01)

(56) References Cited

U.S. PATENT DOCUMENTS

| | | | |
|---|---|---|---|
| 10,309,026 B2 * | 6/2019 | Gershon | C23C 18/1216 |
| 2002/0145826 A1 * | 10/2002 | Zangari | G11B 5/855 |
| | | | 205/108 |
| 2004/0012730 A1 | 1/2004 | Pan | |
| 2004/0039717 A1 * | 2/2004 | Nugent | B82Y 10/00 |
| | | | 977/839 |
| 2007/0148949 A1 * | 6/2007 | Suh | H01L 24/13 |
| | | | 257/E21.511 |
| 2007/0228537 A1 | 10/2007 | Inotsume | |
| 2008/0108227 A1 * | 5/2008 | Kumagai | H10N 99/05 |
| | | | 257/E29.322 |
| 2008/0143019 A1 | 6/2008 | Chou | |
| 2009/0072408 A1 * | 3/2009 | Kabir | H01L 24/32 |
| | | | 257/773 |
| 2009/0079035 A1 * | 3/2009 | Wang | H01L 21/0237 |
| | | | 257/E29.089 |
| 2009/0232991 A1 * | 9/2009 | Wang | H01L 23/373 |
| | | | 427/299 |
| 2010/0144535 A1 * | 6/2010 | Strachan | H10N 99/00 |
| | | | 977/932 |
| 2010/0200199 A1 * | 8/2010 | Habib | F28F 13/185 |
| | | | 29/890.032 |
| 2010/0261343 A1 * | 10/2010 | Mizukoshi | B82Y 10/00 |
| | | | 257/E21.294 |
| 2011/0039459 A1 * | 2/2011 | Yancey | B82Y 10/00 |
| | | | 174/128.1 |
| 2011/0204330 A1 * | 8/2011 | LeMieux | H01L 29/0673 |
| | | | 977/750 |
| 2012/0298170 A1 * | 11/2012 | Lee | H01L 31/022475 |
| | | | 438/93 |
| 2014/0235049 A1 * | 8/2014 | Yang | H01L 23/528 |
| | | | 438/610 |
| 2016/0086915 A1 | 3/2016 | Cheng | |
| 2016/0143153 A1 | 5/2016 | Stay | |
| 2017/0110688 A1 | 4/2017 | Slafer | |
| 2017/0215280 A1 | 7/2017 | Chaji | |
| 2018/0151884 A1 * | 5/2018 | Yushin | H01M 4/625 |
| 2018/0161871 A1 * | 6/2018 | Morsi | B22F 10/20 |

* cited by examiner

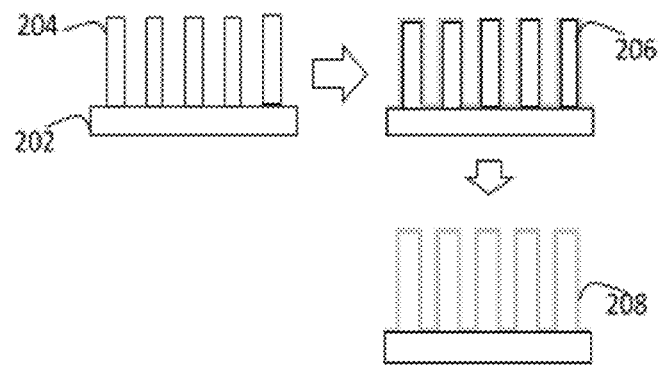
FIG. 2A1
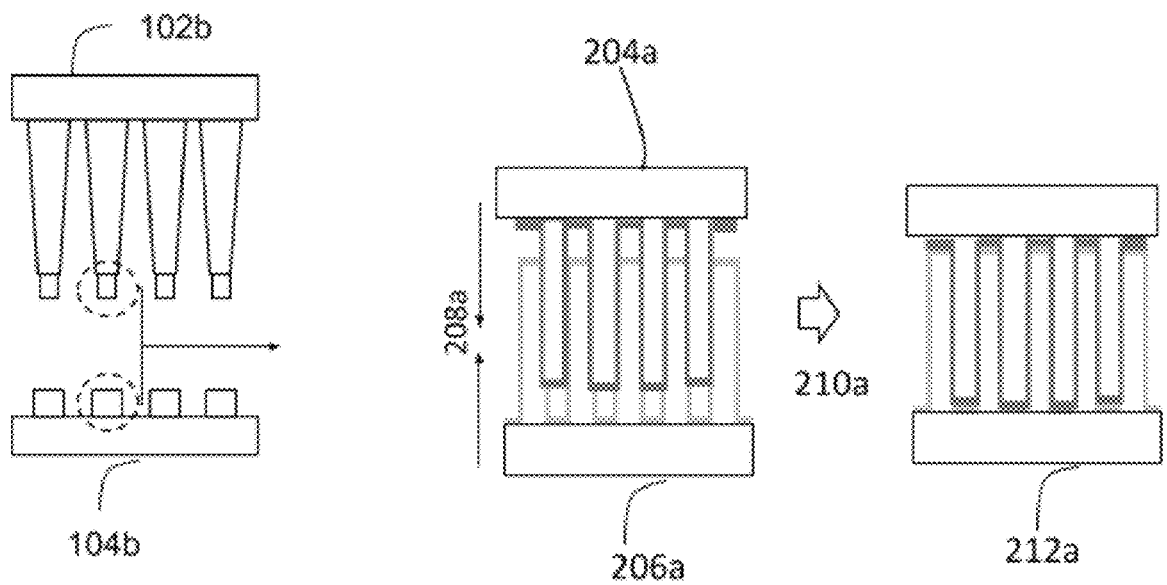
FIG. 2A2

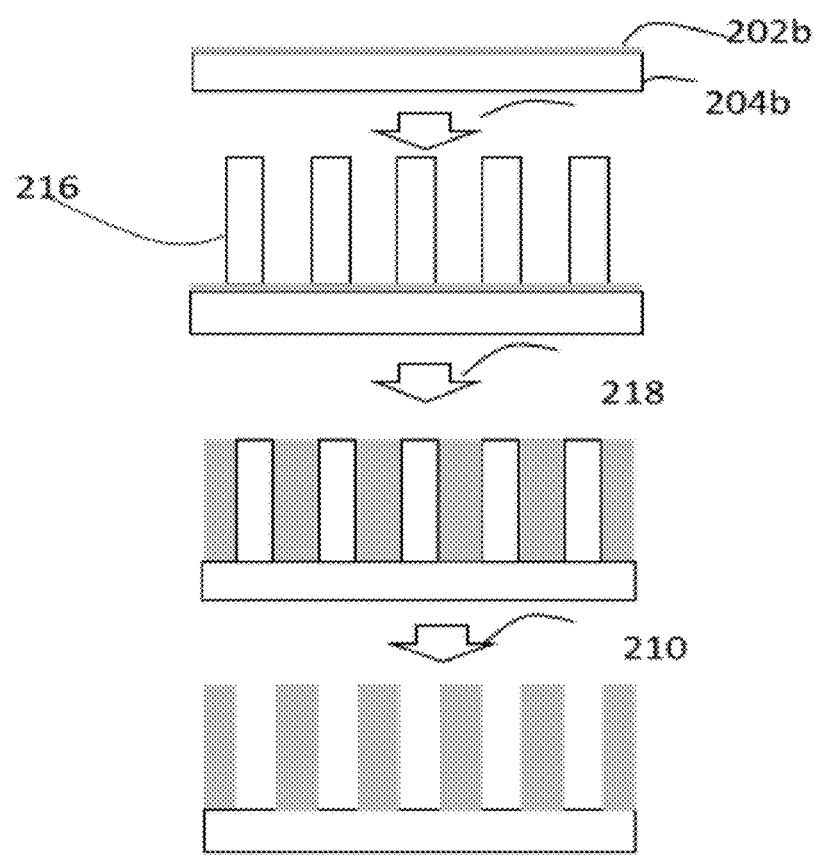
FIG. 2B1

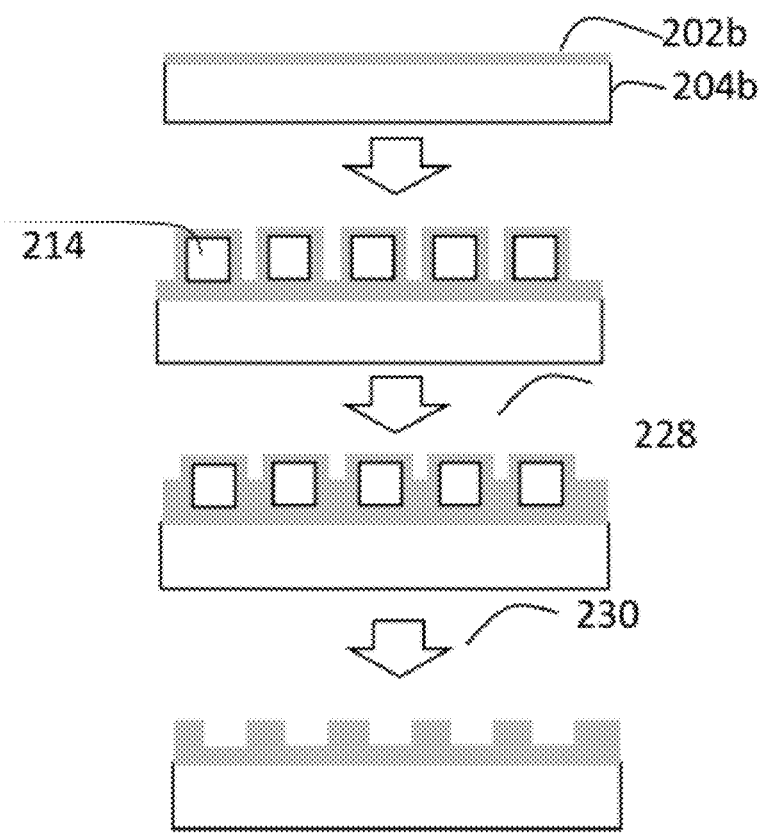
FIG. 2B2

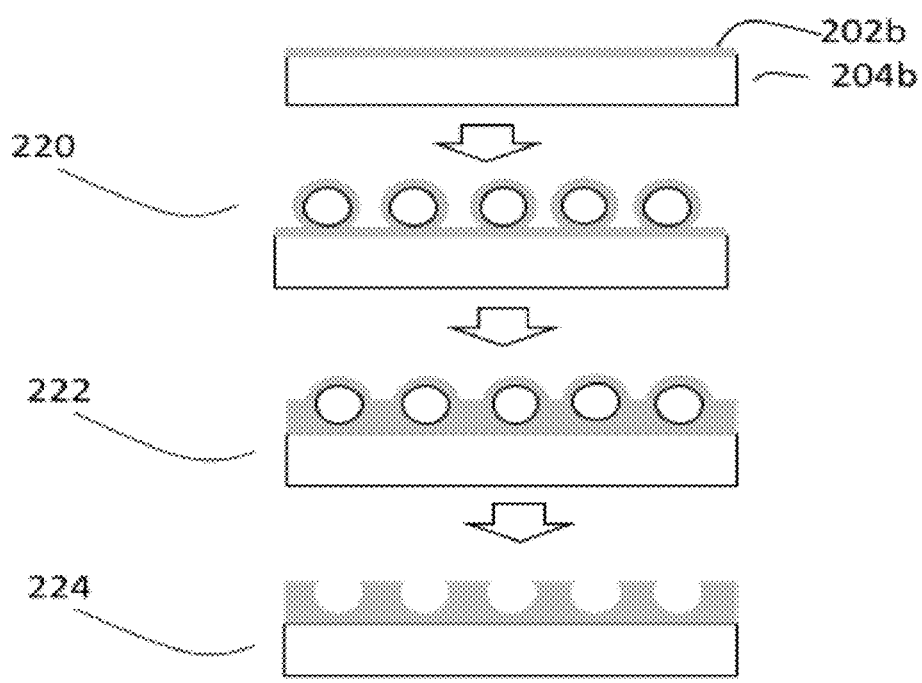
FIG. 2B3

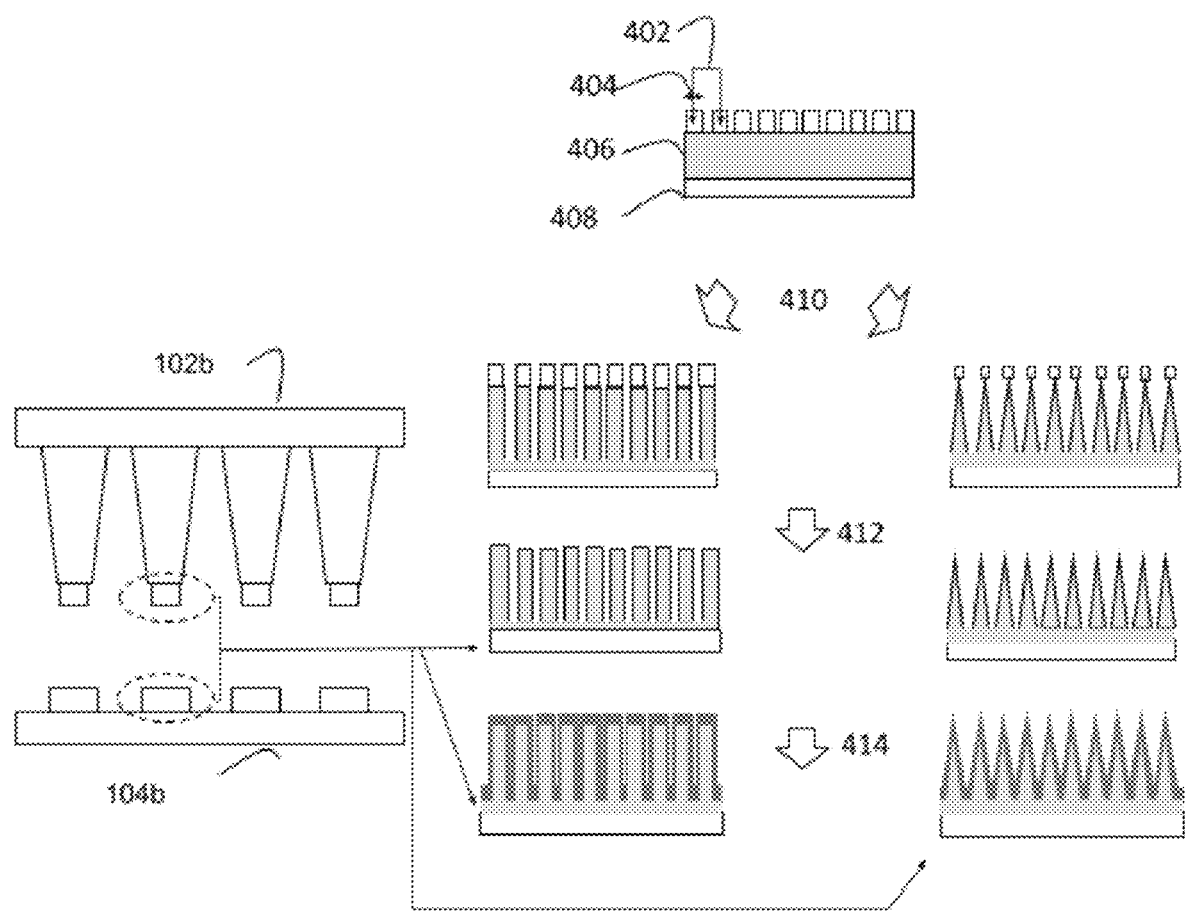
FIG. 4A1

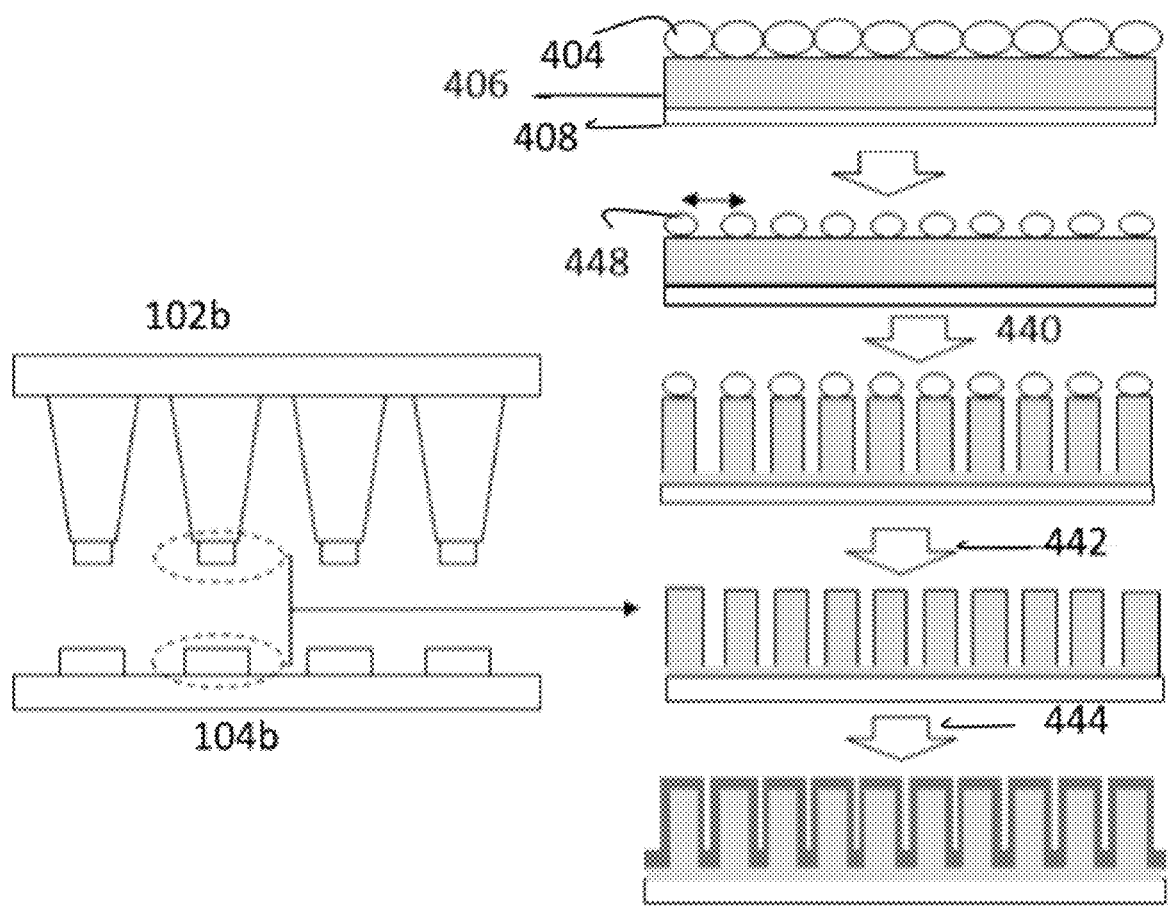
FIG. 4A2

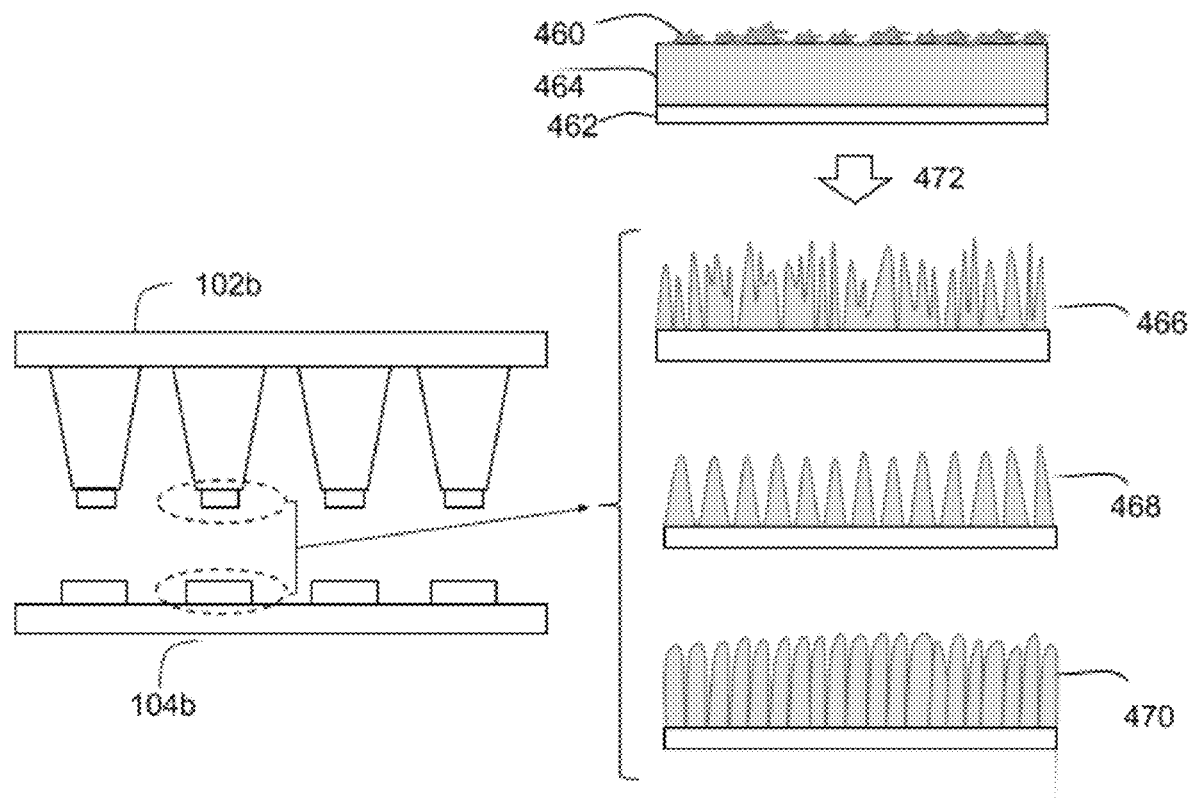
FIG. 4B1

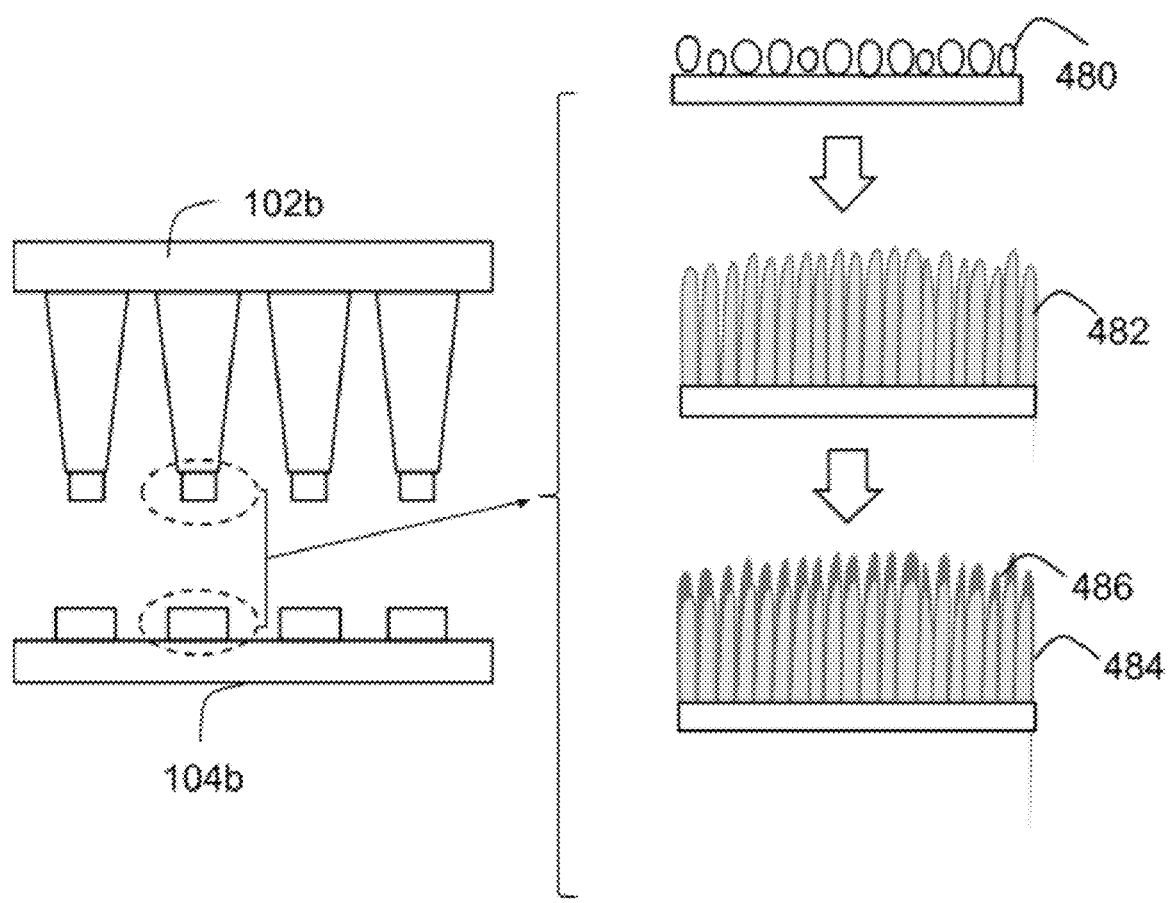
FIG. 4B2

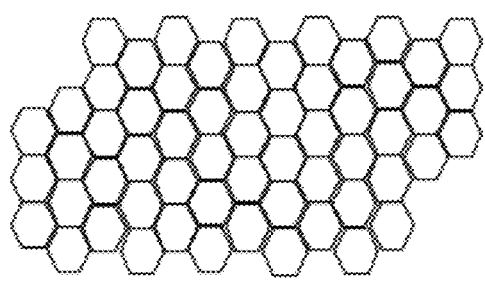
702
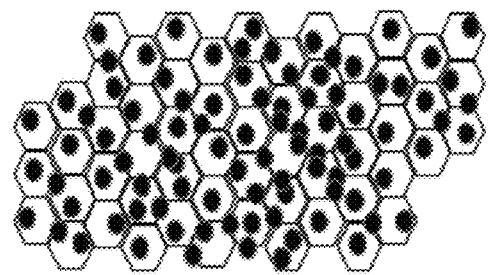
704
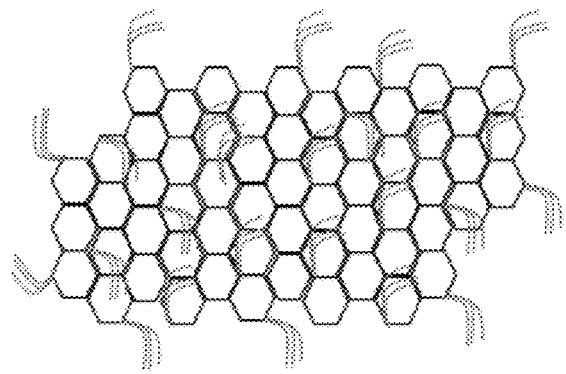
FIG. 7A    706

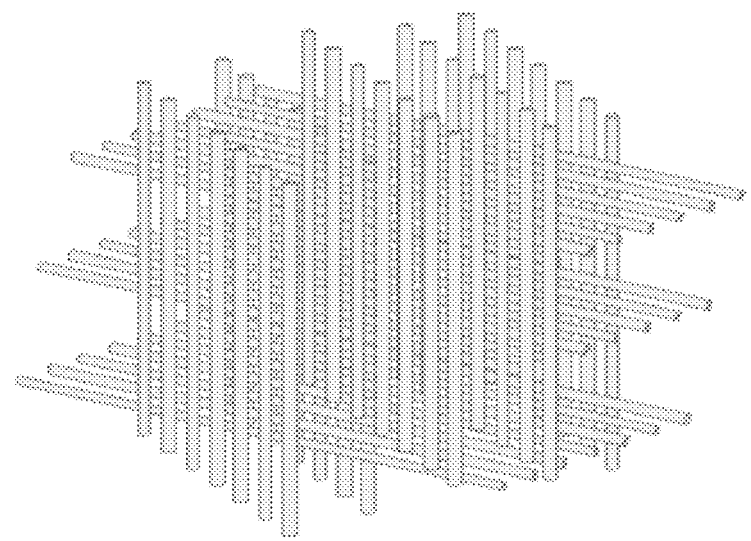
Fig. 8A
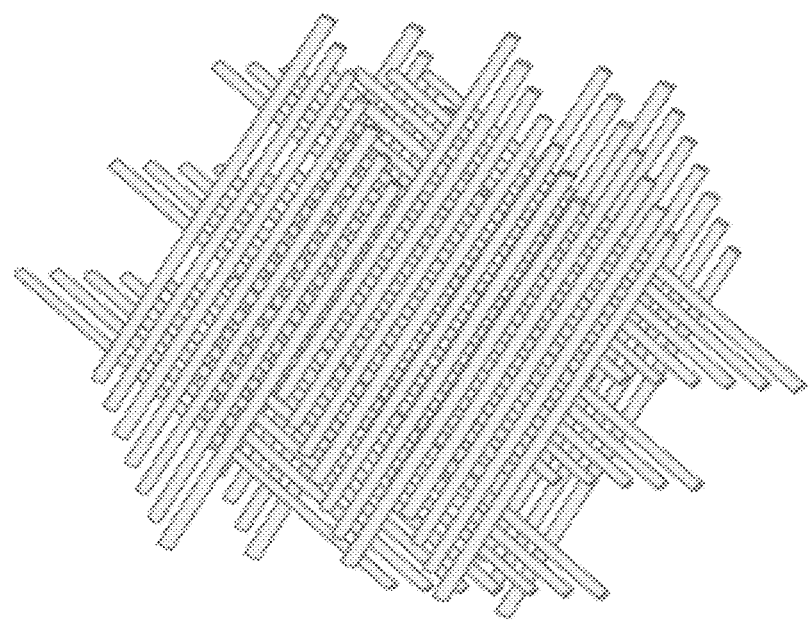
FIG. 8B1

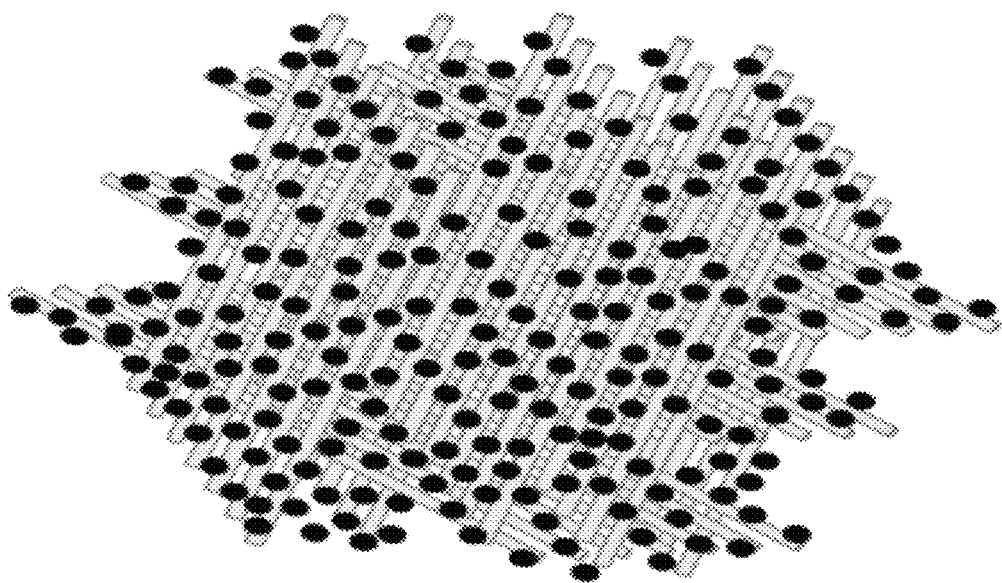
FIG. 8B2

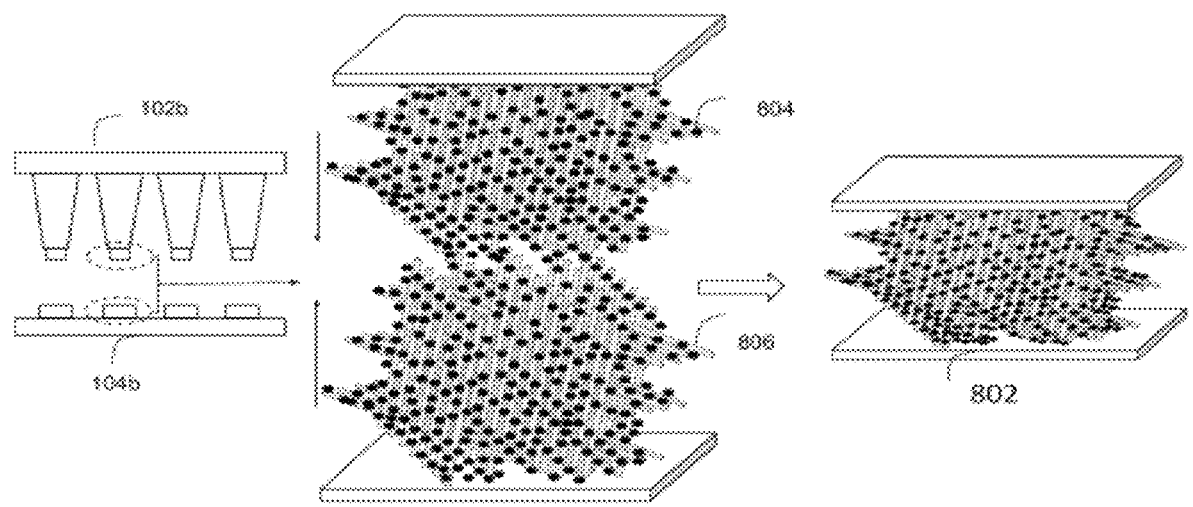
FIG. 8C
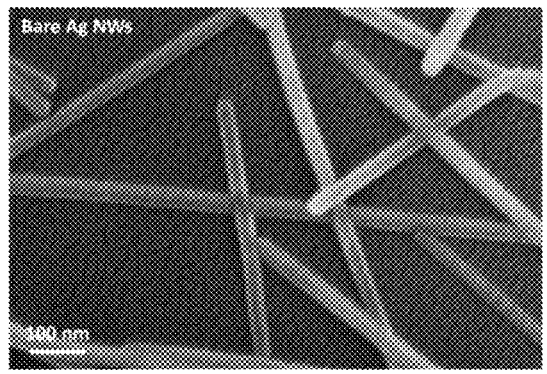
FIG. 8D1
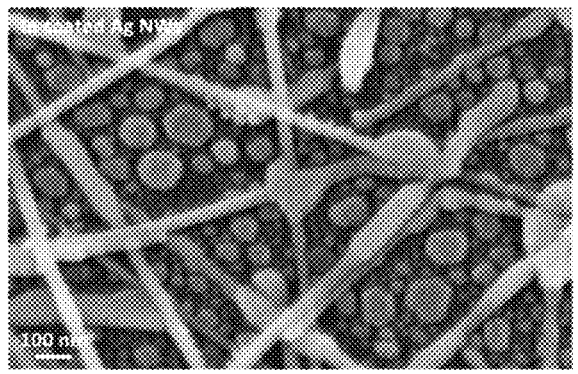
FIG. 8D2
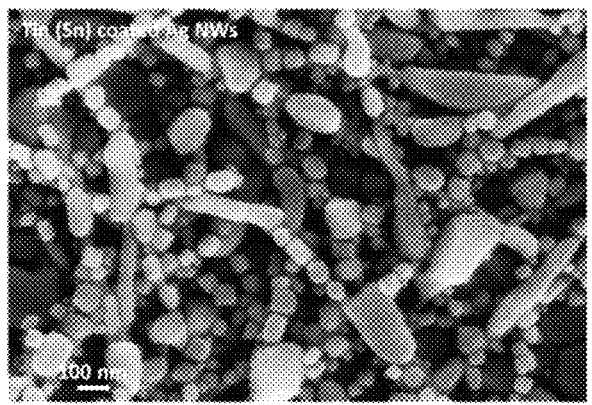
FIG. 8D3

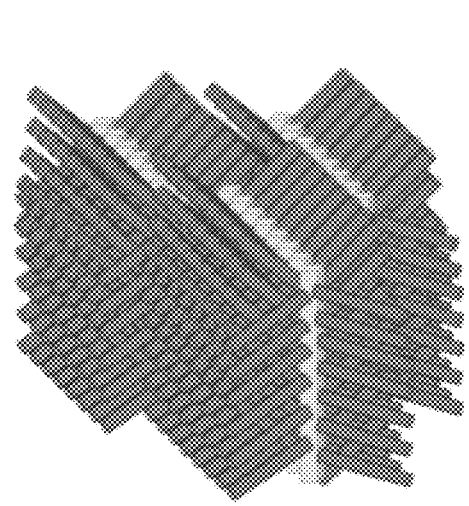
912
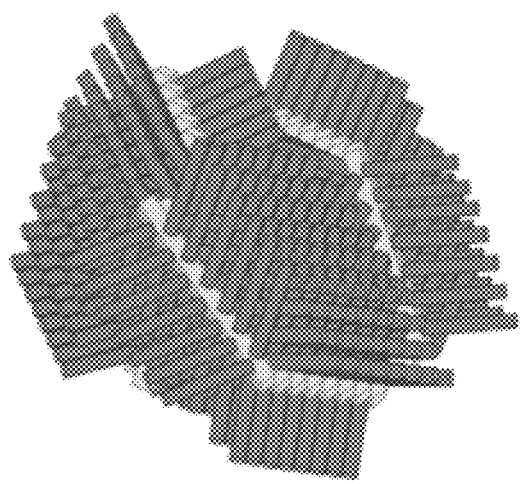
914
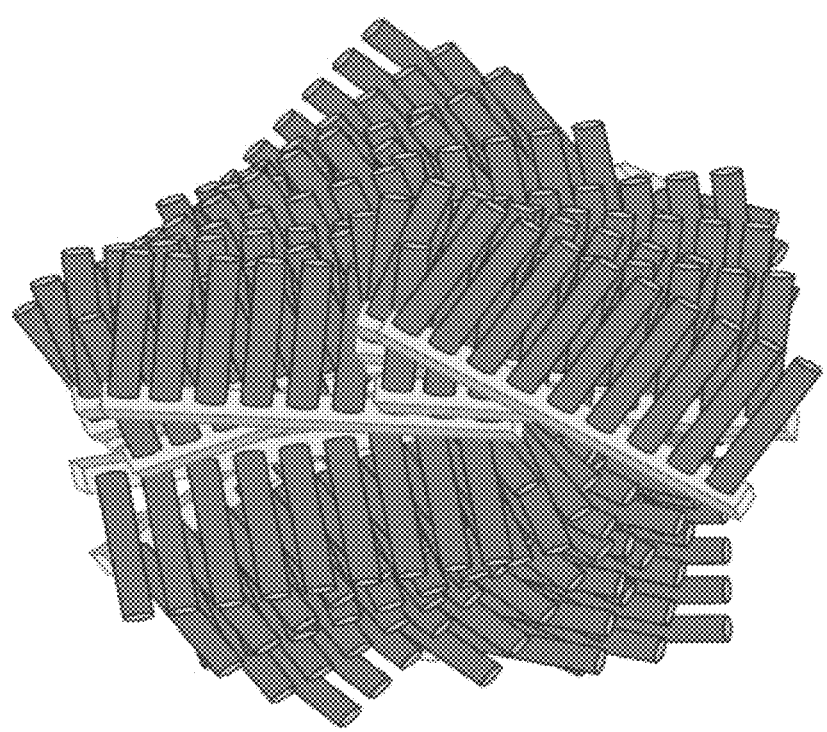
916
FIG. 9C

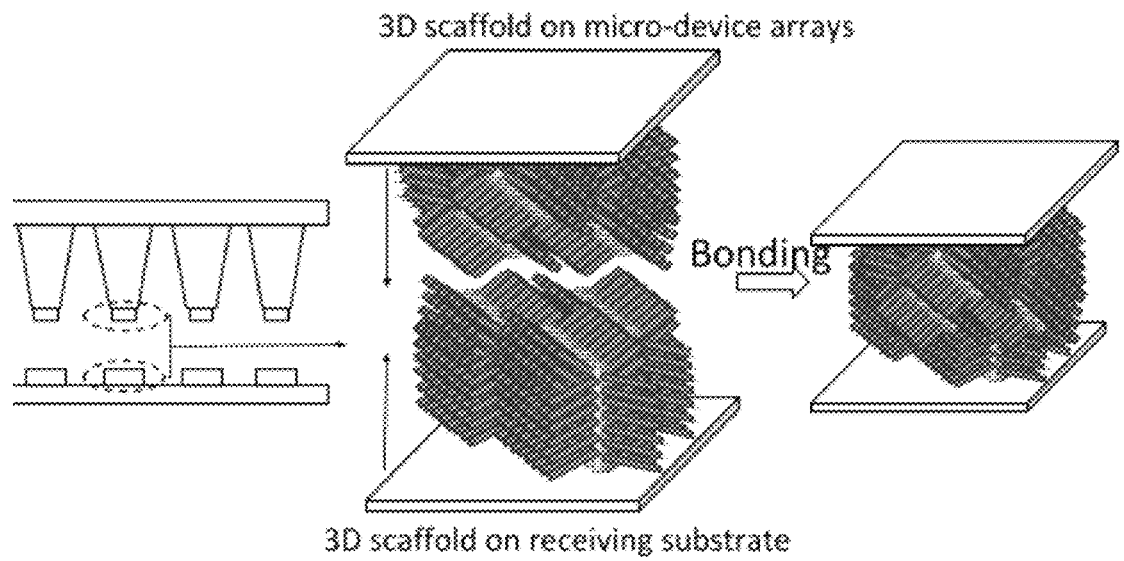
FIG. 9D
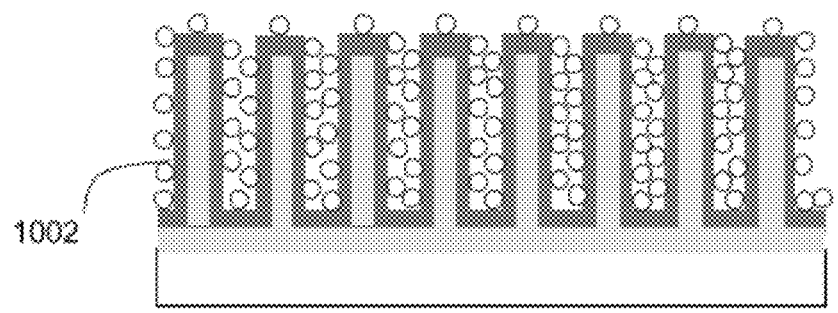
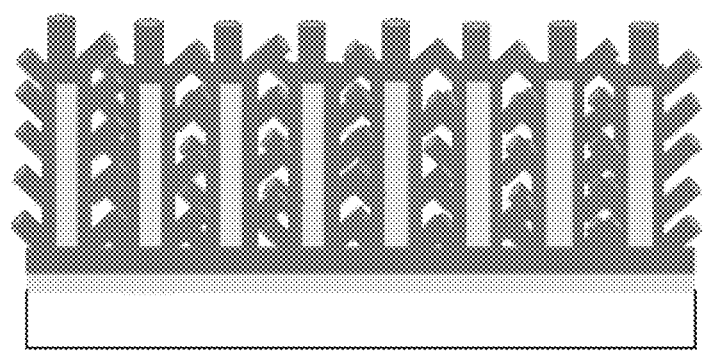
FIG. 10A

INTEGRATION AND BONDING OF MICRO-DEVICES INTO SYSTEM SUBSTRATE

CROSS-REFERENCE TO RELATED APPLICATION(S)

This application is a continuation of U.S. Nonprovisional application Ser. No. 16/189,844, filed on Nov. 13, 2018, now allowed, which claims priority to Canadian Application No. 2,985,254, filed on Nov. 14, 2017, each of which is hereby incorporated by reference herein in its entirety.

FIELD OF THE INVENTION

The present disclosure relates to bonding of micro-devices to other substrates using a low cost and reliable approach that can improve the yield and surface profile. More specifically, the bonding area can be increased and interlocked using 2D and 3D nanostructures with or without using host mediums.

BRIEF SUMMARY

A few embodiments of this disclosure are related to the formation of conductive, flexible and thermally stable 2D and 3D nanostructures on the receiving and/or micro device substrates, for effective bonding of the micro-devices located on a donor substrate. In addition to improved morphological parameters such as surface topography, surface profile, and crystallinity, physical properties such as electrical conductivity, thermal stability, and reliability are enhanced between two substrates (donor substrate & receiving substrate). Decreased pixel pitch of the micro-devices make use of nanostructures critical for effective and reliable bonding.

The micro device array may comprise micro light emitting diodes (LEDs), Organic LEDs (OLEDs), sensors, solid state devices, integrated circuits, (micro-electro-mechanical systems) MEMS, and/or other electronic components. Candidates for the receiving substrate include, but are not limited to, a printed circuit board (PCB), thin film transistor backplane, and integrated circuit substrate. In the case of optical micro devices such as LEDs, the receiving substrate can be a component of a display, such as a driving circuitry backplane.

BRIEF DESCRIPTION OF THE DRAWINGS

A few embodiments of this description are related to controlling temperature and pressure of the nanostructures during the bonding process, to provide a strong bond.

The foregoing and other advantages of the disclosure will become apparent upon reading the following detailed description and upon reference to the drawings.

FIG. 2A1 shows formation of arrays of nonporous/nanopores nanostructures on substrate using BCP or AAO template and consecutive deposition of bonding material (e.g. metal) onto the templates.

FIG. 2A2 shows bonding of arrays of nonporous/nanopores nanostructures with coated metal onto micro device and receiving substrates.

FIG. 2B1 shows one example of formation of arrays of nonporous/nanopores nanostructures on substrate using hard mask template followed by metal electroless plating in open areas or electrochemical metal deposition.

FIG. 2B2 shows another example of formation of arrays of nonporous/nanopores nanostructures on substrate using patterned etch mask template followed by metal electroless plating in open areas or electrochemical metal deposition.

FIG. 2B3 shows another example of formation of arrays of nonporous/nanopores nanostructures on substrate using silica or polymer nanosphere templates followed by metal electroless plating in open areas or electrochemical metal deposition.

FIG. 4A1 shows one example of formation of ordered arrays of nanopillars using nanosize hard masks and etching.

FIG. 4A2 shows another example of formation of ordered arrays of nanopillars using nanosize hard masks and etching.

FIG. 4B1 shows random formation of nanostructures through self-masking and etching.

FIG. 4B2 shows random formation of nanostructures through seed formation and hydrothermal growth followed by subsequent metal deposition.

FIG. 7A shows formation of metal nanoparticles/nanowires decorated reduced graphene oxide (rGO).

FIG. 8A shows 3D scaffold of aligned crossed metallic/TCO nanowires and nanofibers.

FIG. 8B1 shows 3D scaffold of randomly crossed metallic nanowires and nanofibers FIG. 8B2 shows 3D scaffold of randomly crossed metallic nanowires and nanofibers decorated with metal nanoparticles.

FIG. 8C shows interlocked bonding of 3D scaffold of randomly crossed nanowires/nanofibers decorated with metal NPs between micro-device arrays and receiving substrates.

FIG. 8D1-8D3 shows the SEM images of bare Ag NWs, Indium coated Ag NWs and Tin (Sn) coated Ag NWs, respectively according to an embodiment of the present invention.

FIG. 9C shows 3D scaffold of aligned/random/comb-like hierarchical nanostructures.

FIG. 9D shows bonding of 3D scaffold of aligned hierarchical nanostructures between micro-device arrays and receiving substrates.

FIG. 10A shows branch-type nanowires with improved interlocking properties with nanowire.

DETAILED DESCRIPTION

Figure 1A:
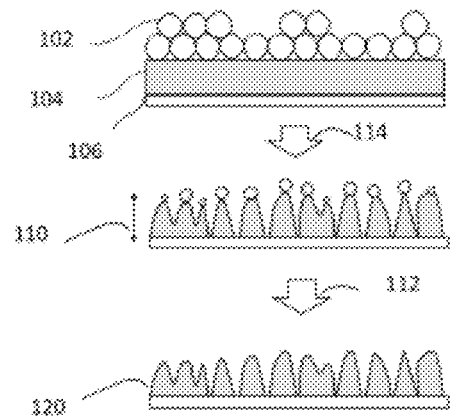
FIG. 1A shows randomly formed nanotextures combining nanoparticle hard masks and mask removal by etching.

Unless defined otherwise, all technical and scientific terms used herein have the same meaning as commonly understood by one of ordinary skill in the art to which this invention belongs.

As used in the specification and claims, the singular forms "a", "an" and "the" include plural references unless the context clearly dictates otherwise.

In this disclosure, the terms 'nanoparticles', 'nanostructures', 'nano-pillars', and nanowires' are used interchangeably. 'Nanostructures', 'Nano-pillars', and 'Nanowires' may be defined as structures that have a thickness or diameter constrained to tens of nanometers or less and an unconstrained length.

In this disclosure, the terms 'device', 'vertical device' and 'micro-device' are used interchangeably.

The process of transferring a plurality of micro devices into a receiver substrate involve bonding of a pre-selected array of micro devices to the receiver substrate, followed by removing the donor substrate. Several bonding processes have already been developed for micro devices.

In the present disclosure, pads in a receiver substrate refers to a designated area in the receiver substrate to where a micro device is transferred. The pad could have some form of bonding materials to hold the micro device permanently. The pad can be stacked in multiple layers to offer a more mechanically stable structure with improved bonding and conductivity capability.

To create electrical connection between optoelectronic devices and receiver pads on a receiver substrate, the optoelectronic devices gets bonded to the receiver pads. In some cases, bonding layers are deposited on the optoelectronic devices and on the receiver substrate pads to create bonding between them. After a physical connection established between the bonding layers, a plurality of bonding conditions are applied to solidify the bonding. These bonding conditions could be applications of current, light, temperature, and/or pressure. The reliability of these bondings are direct function of surface area of the bond pads and the optoelectronic devices, amount and type/structure of a bonding material used for each pads, and adhesion of bonding layers to the original pads and/or the optoelectronic devices.

As the bonding pads become smaller for the high density devices that is made of array of optoelectronic devices bonded to the receiver substrate, the bonding yield, performance, and reliability becomes more challenging.

According to one embodiment, to improve the bonding reliability and yield, the surface of the bond pads either on the receiver substrate or the optoelectronic devices (micro devices) gets textured. Here, a layer of conductive (or nonconductive) material is deposited as mask. This layer should be at least covering the bond pad areas. After deposition of the conductive layer, other processing may be done on the layer (or layers) such as surface treatment, patterning, and or functionalization. Then, the layer (or layers) is textured by different means such as ion milling, laser ablation, reactive ion etching (RIE), other means of dry etching, or wet etching. The texture increases the surface area of the bond pads and also creates an interlocking case that can tolerate high mismatch between different pads.

According to another embodiment, the bonding layers, and/or bonding agent is deposited on the surface of the pads. In one case, a thin layer of soldering materials (such as In, Tin, etc.) is deposited. In another case, nano particles (either solid conductive or hybrid shell-core conductive/non-conductive) are dispersed in the surface of the pads. These nanoparticles can be suspended inside a solution that can also act as a bonding agent (and fillers of the empty space) or it can evaporate and leave the nanoparticles on the surface. In one case, the texturing can go through all layers till it reaches the pads. This case will consist of stand alone 3D structure that are connected only through pad surface area.

In another case, 3D structures are grown on the surface (at least on the pad surface). Here, the 3D structure such as nanowire can be conductive. In one case, it can be also the bonding agent. In another case, other layers can be deposited on top of the nanowire to create the bonding agent. In another case, nanoparticles such as other nanowire, 2D sheets, or spheres (e.g. silica coated metal nanoparticles) can be dispersed between the 3D structures. In another case, solutions can be used to fill the area between the 3D structures (in case of using dispersed nanoparticles, this solution can be the same as the solution of the dispersed nanoparticles). In some cases, the conductive 3D structure (i.e metallic nanowire) does not offer significant structural rigidity required for bonding. In this case, a non-metallic nanowire core is deposited and the surface is covered by conductive layers (and/or bonding layers). These layers also connect the surface of the 3D structures to the pad surface or microdevice. In another case, the non-metallic nanowire is used as structural support for conductive materials such as metallic nanowire, 2D sheets (reduced graphite layers), spheres and more. Other methods used for bonding of 3D structures can be used with these structures as well.

In one case, the 3D structures (either formed by the texturing or growth) can be branched through extra growth process. The extra branches can offer higher surface and better interlocking.

If 3D structure is outside the pad surface area (either by surface texturing or growth), it will not be connected to any active element on the receiver substrate or microdevice substrate. These structures can be removed by etching or can remain on the surface and offer some extra functionality. In one case, they can offer structural support. Moreover, these structures can be designed to offer certain optical performance such as filtering of certain wavelength to offer better color purity and/or light directionality. In another case, they can be used as other sensors such as capacitive touch. As the aspect ratio of this structures is very high, the electric field at the top can be very high. Therefore, a small disturbance caused by outside source can create significant change in the electric field which can be detected as a touch input.

In another embodiment, scaffold structure is used to enhance the bonding property between optoelectronic device and receiver substrate. In one case, the scaffold layer is grown or formed on at least the pad surface. One method is to develop a template on the surface. These template can be made of particles such as spheres, AAO, patterned photoresist, block-copolymers, etc. Then, at least one conductive layer is deposited on the template. After that, the template can be removed or stay inside the structure. Here, other bonding layers or agents (nanoparticles, polymers . . . ) can be used. In another case, the scaffold is transferred or deposited on the surface. Here, in one case, at least one adhesion layer is used between the scaffold structure and the pad (or micro device) to hold the scaffold in place. In another case, a adhesion layer is deposited (different methods) after the scaffold is transferred or deposited on the surface. The adhesion layer can be different materials such as soldering materials, polymers, functional solution with nanoparticles, and etc.

In one embodiment, the contact area (bonding area) on the receiver and/or micro device substrate is increased using nanotextured, nanoporous, and nano-pores structures with large active surface areas. The nanotextured and nanoporous structures can be formed randomly or in a defined ordered. For example, the nanopores can be formed as arrays of aligned pores or random porous structures.

In another embodiment, conic and needle-like nanostructures, pillars, and nanowires (NWs) made from transparent conductive oxides (TCO), metals, and/or conductive graphene-based materials such as reduced graphene oxide (rGO) and carbon nanotubes (CNTs) are used. These upright (or slightly tilted) structures provide a vertical current path with low resistivity, and show advantages of mechanical flexibility, and thermal stability. The nanostructures can be randomly formed in high density arrangements, or fabricated in ordered array structures with desired size and pitch. The number of nanostructures will be optimized for maximum vertical conduction.

In this embodiment, the structures are formed through etching a planar layer. A thin film layer is deposited through different methods (e.g. plasma enhanced chemical vapor deposition (PECVD), sputtering, printing, spin coating, . . . ) to use as a hard mask and then a pattern is formed on top of the layer. The layer is etched using different methods (ion milling, dry etching, wet etching, laser ablation and etc) to form a 3D nanostructure. The structure can be formed either by etching the entire layer or only partially etching of said layer.

In another method, the nanostructure is self assembled on the surface. The surface of pads area either on the micro device or receiver substrate is treated either through deposition or different curing process (e.g. surface functionalization, etc) to enable selective assembly of the structure on the pad areas or the entire surface area.

In another embodiment, the nanostructure is covered by another layer to enhance the bonding process. In one case, the structures are covered by materials that can be either cured through current, light, thermal, mechanical force, or chemical reaction. In this case, after aligning and connecting the receiver substrate and micro-devices together, the required curing agent is applied to enhance the bonding.

In another embodiment, a space between the structures can be filled with other materials to enhance the bonding process. These materials can be curable under different conditions and curing agents (current, lights, pressure, thermal, and etc).

In another embodiment the entire surface of either receiver or micro device substrate is covered with the nanostructures including the pad areas and the space between the pad areas. However, the nanostructures (nanowires, nanoparticles, silica coated nanoparticles, etc) are sparse so that there is no connection between the structures. In one case, the structures can be separated by some dielectric materials such as polyamide, SU8, PMMA, etc thin film layers. Here, the micro-devices and the receiver substrates are aligned and bonded together through the structures formed on the surface. The bonding can be enhanced using different curing process. In one case, current can be applied through the structures to passing through the micro devices for micro/nano welding/joints. In another case, higher temperature, pressure, and/or light can be used to enhance the bonding process.

In one embodiment, interlocked nanostructures with extremely large surface areas are formed using randomly crossed metallic nanowires, branch-type nanowires, carbon nanotubes, 3D metallic, and carbon nanofibers, and metallic mesh/clothes, forming a 3D scaffold. The crossing of NWs spatially extend the bonding area, leading to effective bonding.

For the above embodiments, the size (diameter), length, and concentration of nanostructures in the pad area are engineered to maximize the bonding profile. Thus, maximum performance is achieved.

One embodiment utilizes anchored nanoparticles onto the NWs/rGO and CNTs using a layer by layer (LBL) assembly process. In these structures, the metallic/rGO NWs and CNTs will be decorated with metallic, silica-coated metal, and metal coated silica nanoparticle nanofillers, such as silver, silver/silica, and nickel NPs. Such structures enhance surface area, producing high performance conductive adhesives. As a result, a maximum bonding area and an optimal conduction path between two pads will be achieved.

Other embodiments are related to the combination of silica or polystyrene nanobeads and metal NPs, metal and graphene nanowires, or CNTs, in a 3D assembly. Conductive nanoparticles, metal and rGO NWs, and CNTs are diffused into the 3D silica or polystyrene crystal to create a vertical current path for selective bonding. During the bonding process, the silica itself acts as a mechanically robust material under pressure and temperature.

A few embodiments of this description are related to the embedment of as-formed nanostructures (porous structures, metal and rGO NWs, CNTs, metal, and silica coated NPs) into transparent and a mechanically flexible and thermally stable host medium.

A few embodiments of this description are related to controlling the current, temperature and pressure applied during the bonding process, to provide a strong bond.

The aim of this disclosure is to describe the applications of metal nanostructures for efficient and durable bonding between two substrates at low temperature. Metal-containing nanostructured materials has been widely utilized in industrial practices due to their unique chemical-physical properties. High cohesive energy and melting point of nanostructured metals lead to extended component stability during bonding (correlating to improved reliability). The high surface activation energy of the metallic particles is crucial for robust bonding between two surfaces. Metal nanoparticle synthesis and surface chemical modification is simple which makes systems containing metal nanoparticles particularly interesting. Here, all of process presented regarding metal nanostructure fabrication are high throughput processes conducted at low temperatures, and compatible with conventional semiconductor processes.

2D and 3D metal nanostructures have superior properties, including unique morphological structures, large surface area and high electrical conductivity.

Various embodiments in accordance with the present structures and methods are described below in details.

FIG. 1A shows randomly formed nanotextures combining nanoparticle hard masks and subsequently mask removal by etching. As shown in FIG. 1A, 2D metallic textured structures are formed on a substrate 106 with a bonding material 104 by combining nanomasking and etching. Nanoparticles 102 such as aluminum oxide ($Al_2O_3$), silica and polystyrene nanospheres or other masks can be used as etch-masks. An etching process 114 such as reactive ion etching (RIE) using anisotropic plasma chemistry with high etching selectivity to metal, physical etching through a milling process, and a simple yet controlled wet etching process can be used to form metallic nanotextures 120. The geometry and size of the textures can be adjusted by the size of the etch masks and etching conditions. The depth 110 of the nanotextures can be equal to depth of metal layer used as bonding material 104. The process 112 of mask removal can be achieved with simple ultrasonication or chemical etching.

Figure 1B:
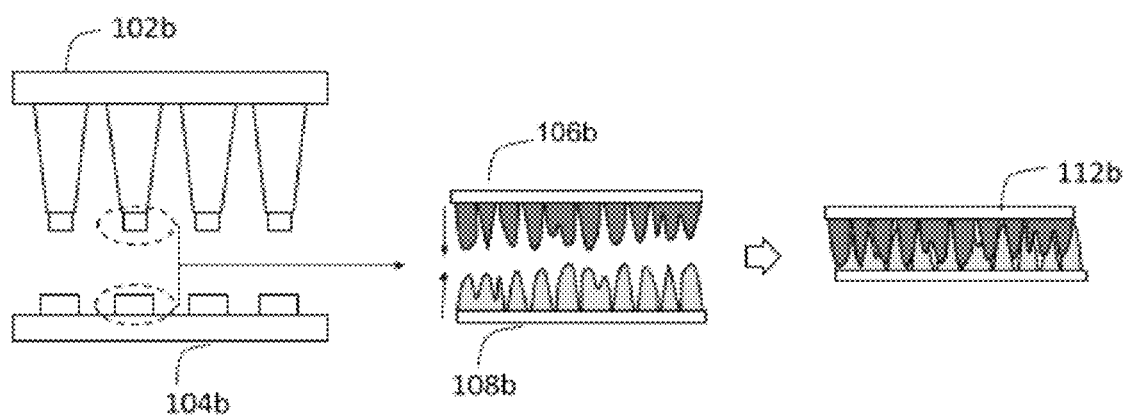
FIG. 1B shows bonding of nanotextured metal onto micro device and receiving substrates.

FIG. 1B shows bonding of nanotextured metal onto micro device and receiving substrates. The nanotextured structure can be formed either on the receiver substrate 104b or the micro device pads 102b. In one case, nanotextured metal on pads of micro arrays 106b and nanotextured metal on pads of receiving substrate 108b can be formed. During bonding, the surface texture can accommodate some height difference between different pads and/or micro devices. Moreover, the surface texture create more surface area for more reliable bonding. The bonding 112b between nanotextured metal on pads of micro arrays 106b and nanotextured metal on pads of receiving substrate 108b creates a large surface area with interlocked bonding 112b.

Figure 1C:
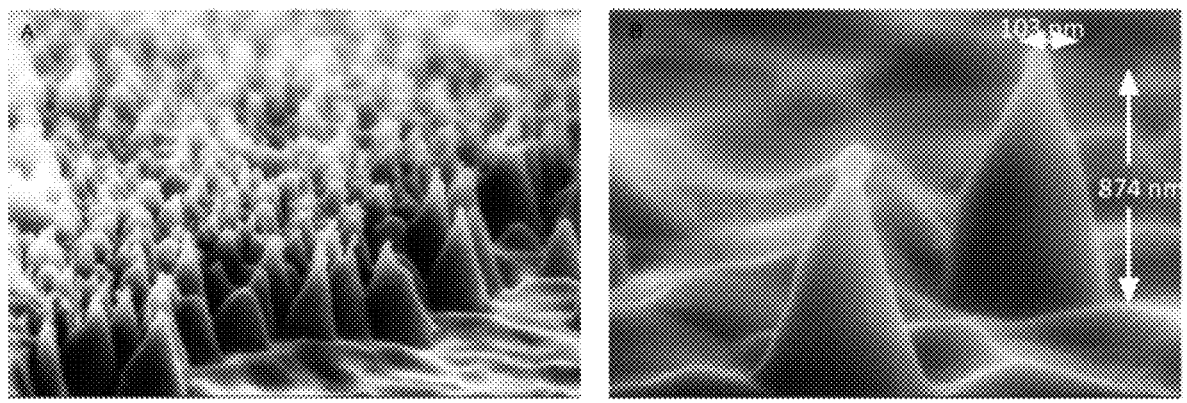
FIG. 1C shows SEM image and magnified image showing realization of silver nanotextures using nanosphere masks and milling.

FIG. 1C illustrates a SEM image and magnified image showing realization of silver nanotextures using nanosphere masks and milling. SEM image A and magnified image B showing realization of silver nanotextures using nanosphere masks and milling. The metal nanotextured structures can also be formed by polymer self-masking in a dry or wet etching processes.

In another embodiment, the surface texture is developed using template and deposition. In this method, a template is formed on a space between the surfaces covered by conductive materials. The template can be removed or left on the surface.

FIG. 2A1 shows formation of arrays of nonporous/nanopores nanostructures on substrate using Block-Copolymers (BCP) or Aluminum Anodic Oxide (AAO) template with engineered size-pitch. As shown in FIG. 2A1, BCPs or AAO 204 with engineered size pitch are used as template on substrate 202. 3D spongy nanoporous and nanopores 208 (random and ordered) are formed by nanotemplating followed by bonding material 206 (e.g metal) deposition/ growth using, PECVD, PVD, CVD, sputtering, printing, spin coating, electroplating, electroless plating, etc.

FIG. 2A2 shows bonding of nanoporous and nanopores metal nanostructures onto micro device and receiving substrates. The structure can be formed either on the receiver substrate 104b or the micro device pads 102b. In one case, nanoporous and nanopores metal nanostructures on pads of micro arrays 204a and nanoporous and nanopores metal nanostructures on pads of receiving substrate 206a can be formed. During bonding 210a, the surface texture can accommodate some height difference between different pads and/or micro devices. Moreover, the surface texture create more surface area for more reliable bonding. In one case, the structures are covered by materials 208 that can be either cured through current, light, thermal, mechanical force, or chemical reaction. The bonding between nanoporous and nanopores metal nanostructures on pads of micro arrays 204a and nanoporous and nanopores metal nanostructures on pads of receiving substrate 206a creates a large surface area with interlocked bonding 212a.

FIG. 2B1-2B3 shows example of formation of arrays of nonporous/nanopores nanostructures on substrate 204b having a bonding material 202b on top of the substrate 204b. In FIG. 2B1, Block-Copolymers (BCPs) and aluminum anodic oxide (AAO) are used as template 216. A electrochemical deposition and electroless plating 218 of a structural layer (e.g. metals such as silver (Ag), Indium (In), nickel (Ni), Co, or metal alloys) can be used to cover the spacings (or holes). The template can be subsequently removed 210 by wet removal process.

FIG. 2B2 shows another example of formation of arrays of nonporous/nanopores nanostructures on substrate 204b having a bonding material 202b on top of the substrate 204b wherein patterned etch mask is used as template 214. A electrochemical deposition and electroless plating 228 of a structural layer (e.g. metals such as silver (Ag), indium (In), nickel (Ni), Co, or metal alloys) can be used to cover the spacings (or holes). The template can be subsequently removed 230 to form nonporous/nanopores nanostructures.

FIG. 2B3 shows another example of formation of arrays of nonporous/nanopores nanostructures on substrate 204b having a bonding material 202b on top of the substrate wherein hard mask such as silica or polystyrene bead or nanosphere are used as template 220. A electrochemical deposition and electroless plating 222 of a structural layer (e.g. metals such as silver (Ag), Indium (In), nickel (Ni), Co, or metal alloys) can be used to cover the spacings (or holes). The template can be subsequently removed 224 either chemically (for example, in dimethylforamide DMF), or through lift-off (in the case of silica templates).

In one embodiment, the shape, pitch and size of the nonporous/nanopores can be adjusted by the size of the nanotemplate.

Figure 2C:
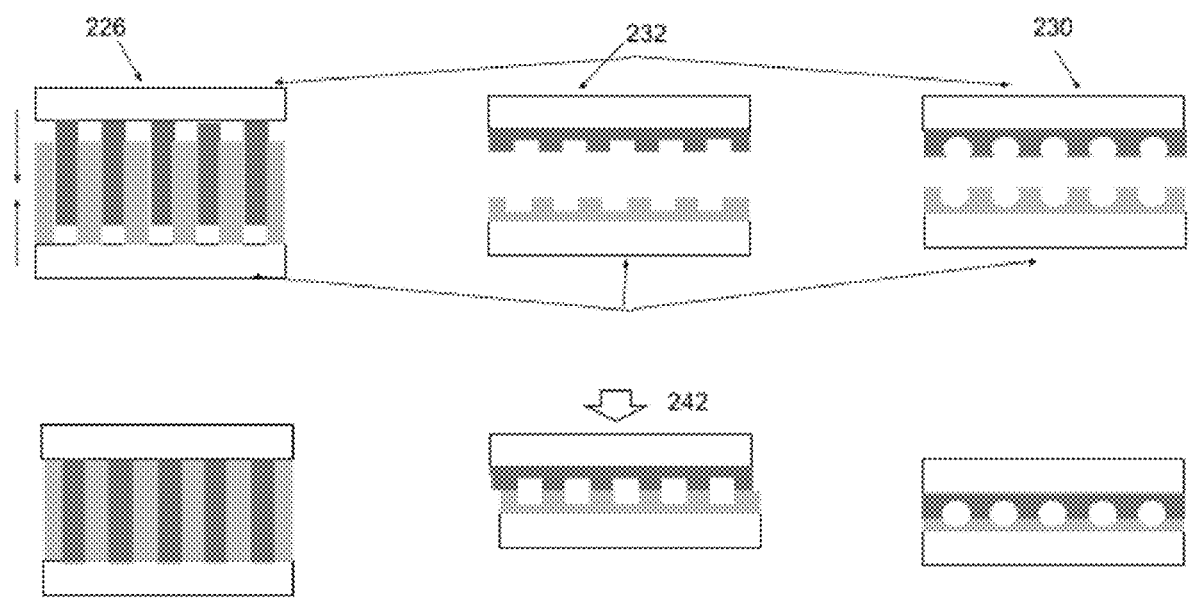
FIG. 2C shows the bonding of nonporous/nanopores nanostructures between micro-device arrays and receiving substrate.

FIG. 2C shows the bonding of nonporous/nanopores structures between micro-device arrays and receiving substrate with different templates. Here, the surfaces can be covered by other bonding or filler layers. In one case, nonporous/nanopores metal nanostructures are formed on pads of micro arrays and receiving substrate with different templates e.g. 226 (Block-Copolymers (BCPs) and aluminum anodic oxide (AAO)), 232 (patterned etch mask), 230 (silica or polystyrene bead or nanosphere). Further, bonding 242 is shown for between micro device and receiving substrate having nonporous/nanopores structures.

One method of accommodating surface roughness is to form porous bonding layer on top of the receiver pads or micro-devices. While the porous layer has mechanical strength to hold the micro-device in place, the elasticity can compensate for the surface non-uniformity. Moreover, the elasticity can provide more tolerance for mechanical stress due to possible folding, rolling or pressure. Here, after forming the porous surface, other layers can be deposited to facilitate bonding between micro-device and the receiver pads. However, the surface itself can be made of bonding materials such as Indium, Tin, Silver, etc. In another embodiment, the templates are fully covered by the conductive layers (some opening can formed). The templates are removed by etching or other means leaving a 3D porous layer. The conductive layer can be deposited on the template after forming the template on the surface or the template can be covered by conductive layer prior forming into the surface.

Figure 3A:
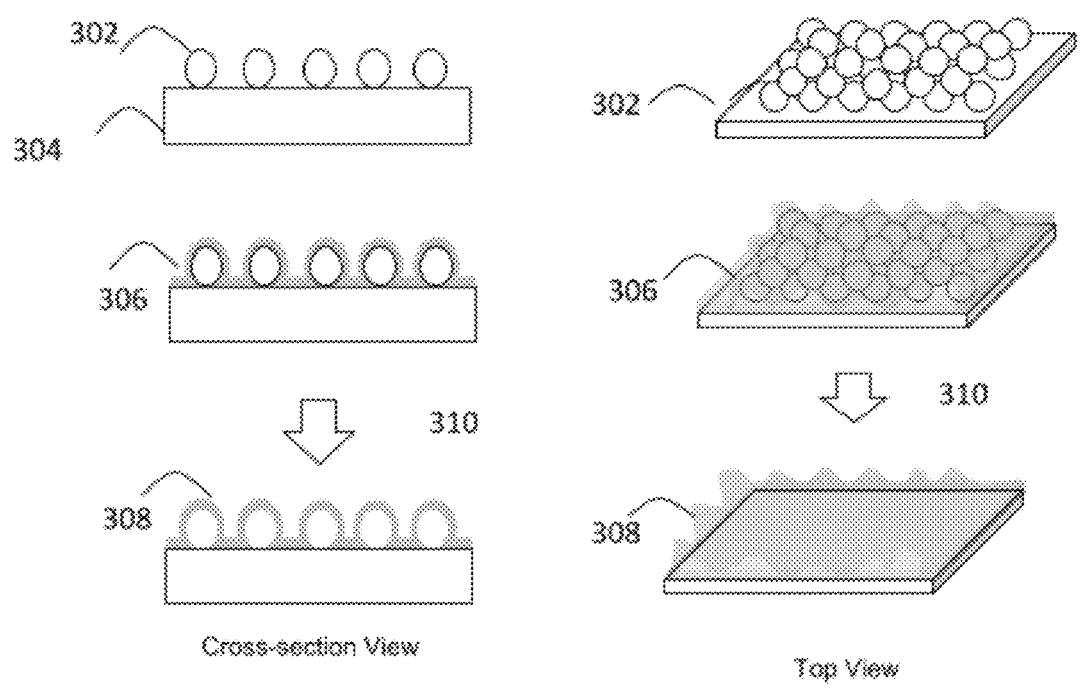
FIG. 3A shows 3D metal nanoporous structure using self-assembly of nanoparticle hard mask template, consecutive metal deposition and etching the template.

FIG. 3A shows cross-section view and top view of formation of metal nanoporous structure using self-assembly of nanoparticle hard mask template such as silica or polymer nanosphere template 302 on the substrate 304. The metal layer 306 can be deposited by PVD and CVD methods following 3D template formation. The template can be removed 310 and 3D nanoporous structure 308 can be formed.

Figure 3B:
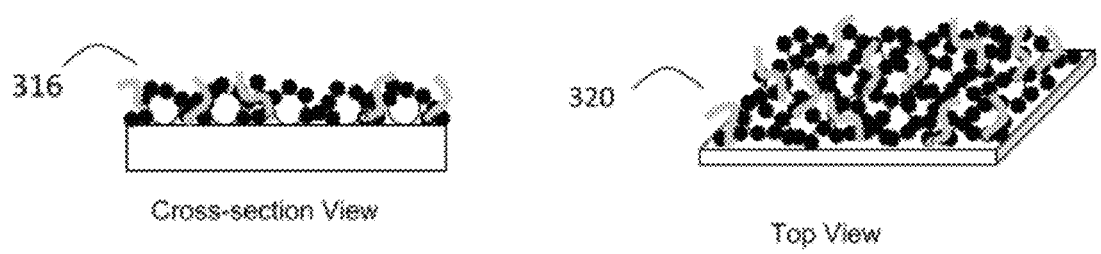
FIG. 3B shows 3D mixture of metal NPs, CNT/rGO NWs and silica nanospheres using self-assembly of nanoparticle hard mask template.

FIG. 3B shows cross-section view 316 and top view 320 of a mixture of metal NPs, CNT, rGO nanowires (NWs), Ag NWs and silica nanospheres to form a template. A 3D metal nanoporous structure will be released upon silica removal.

Figure 3C:
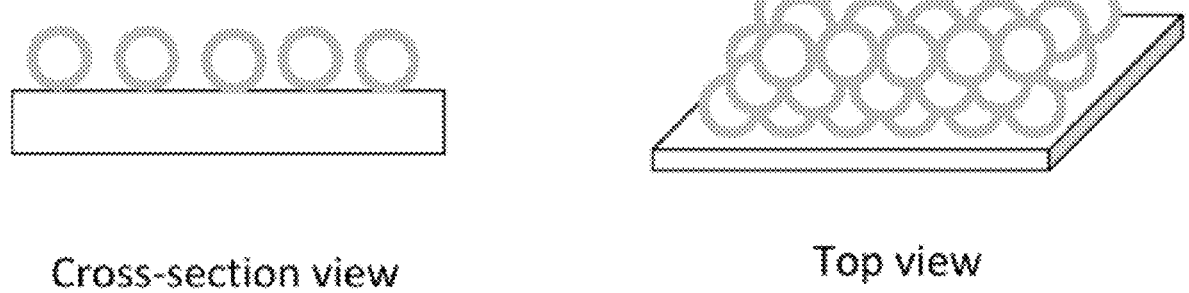
FIG. 3C shows core/shell silica or polystyrene nanospheres with metallic shells using self-assembly of nanoparticle hard mask template.

FIG. 3C, in the third approach shows a cross section and top view of core/shell silica nanospheres with metallic shells form a 3D colloidal crystal template. An array of hollow metallic spheres will form following silica removal.

Figure 3D:
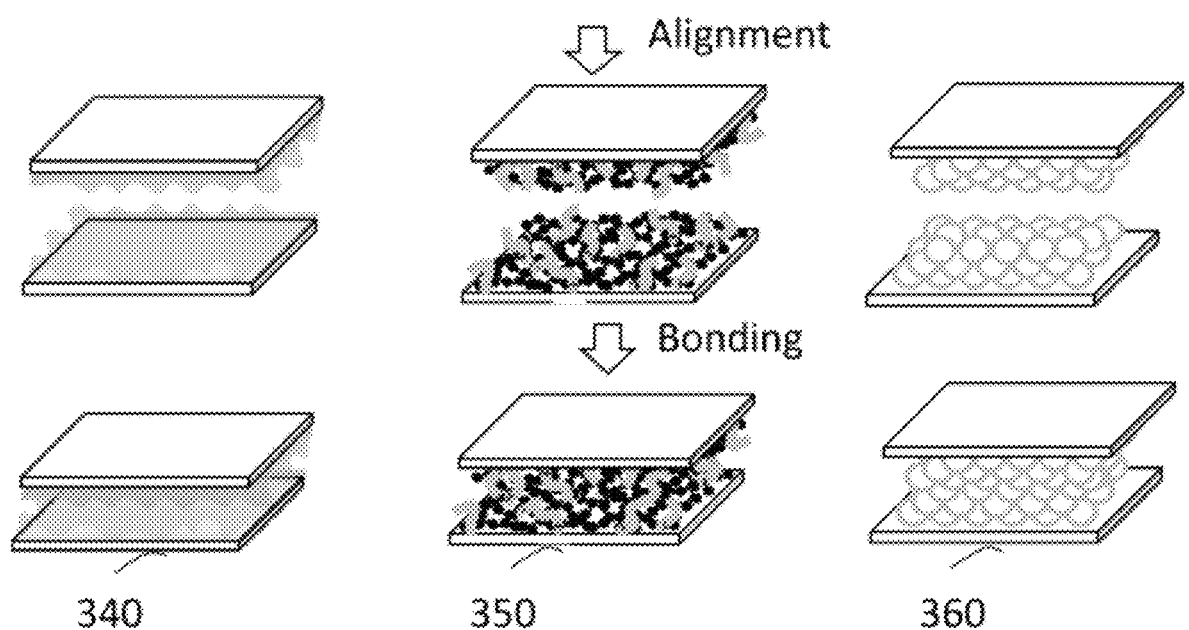
FIG. 3D shows the alignment and bonding of the structures presented in FIGS. 3A-3C.

FIG. 3D shows the alignment and bonding of the structures such metal nanoporous structure 340, 3D metal nanoporous structure 350 and hollow metallic spheres 360 as presented in FIGS. 3A-3C.

FIG. 4A1 shows formation of ordered arrays of nanopillars/nanowires/needles/nanocones nanostructure using nanosize hard masks and etching (dry, milling, wet, laser ablation). FIG. 4A1 shows upright arrays of nanostructures, including conic, needle-like nanostructures, pillars and nanowires, are formed on transparent conductive oxides (TCO) (ZnO, ITO, GIZO, etc) and metals (Ag, Ni, etc). The structures can be fabricated as ordered array structures with desired size and pitch 402. The number of nanostructures will be optimized for maximum vertical conduction. The structures can be formed using both mask or mask-less approaches using similar, but more controlled approaches, as explained here. In the former method, the shape, size, and the pitch (determined by the density of the nanostructures in the bonding area) are controlled by the size of the etch masks. In FIG. 4A1, the hard mask 404 is used as template on substrate 408. The bonding material 406 can be deposited by one of PECVD, sputtering, e-beam, evaporation, plating, printing, spin coating etc. Etch processes can be performed 410 selectivity to the bonding material (TCO, or metal) using either an RIE or a milling process to form needle-like or conic-like nanostructures. The template can be removed 412 and a overcoat layer 414 can be deposited to enhance bonding properties of ordered array of 3D structure on pads of micro arrays 102b and receiving substrate 104b. In one process, formation of conic, needle-like nanostructures can be done by using the same process as of FIG. 4A1 and etching (dry, milling, wet) using silica or polystyrene nanospheres as hard mask.

FIG. 4A2 shows formation of ordered arrays of nanopillars/nanowires/needles/nanocones nanostructure using nanosphere hard masks and etching (dry, milling, wet, laser ablation). Nanosphere can be used as a template 404 on the substrate 408. The bonding material 406 can be deposited by one of PECVD, sputtering, e-beam/evaporation, electrochemical and electroless plating, printing, spin coating etc. Etch processes 440 can be performed selectivity to the bonding material (TCO, or metal) using either an RIE or a milling process to form needle-like or conic-like nanostructures. The structures 448 can be fabricated as ordered array structures with desired size and pitch. The template can be removed 442 and a overcoat layer 444 can be deposited to enhance bonding properties of ordered array of 3D structure on pads of micro arrays 102b and receiving substrate 104b.

FIG. 4B1-4B2 shows random formation of nanostructures through self-masking and etching. In one embodiment, the structures can be fabricated as ordered array structures with desired size and pitch randomly formed in a high density arrangement. FIG. 4B1 illustrates polymer self masking 460 used on the substrate 462 and bonding material 464. The random 466/cone-like 468/needle-like 470 formation of nanostructures can be achieved by top down etching 472 such as dry, wet, and milling and these structures can be formed either on the receiver substrate 104b or the micro device pads 102b.

FIG. 4B2 shows random formation of nanostructures through seed formation 480 and hydrothermal, CVD, and LPCVD growth 482 followed by subsequent metal deposition 486. The random/cone-like/needle-like formation of nanostructures can be achieved using a hydrothermal CVD, and LPCVD growth 482. In such processes, the geometrical parameters of the nanostructures are controlled by the precursor/gas chemistry and hydrothermal/plasma condition. As formed nanostructures 484 can be overcoated with layers 486 with good bonding properties to enhance the bonding quality. The random/cone-like/needle-like formation of nanostructures can be achieved by growth and subsequent (bonding material) deposition and these structures can be formed either on the receiver substrate 104b or the micro device pads 102b.

In addition to top down etching, TCO NWs can be grown using the hydrothermal method at a low temperature compatible with most receiver substrate (e.g ~150° C.). The grown structures 482 can be used as active bonding areas, or as supporting templates for desired metallic films 486 such as Ag, Au, In, Tin, In/Tin, Ni, Cu, Co, etc. In this case, the array of nanowires is formed with materials that are compatible with low temperature process and have better mechanical strength (e.g ZnO). The surface of the nanowires is then can be covered by conductive and bonding layers.

The various metal nanostructures as mentioned such as nanocones, nanopillars, and nanowires can be produced using a wet chemical etch process such as selective metal nanoscale etch method (SMNEM). The wet chemical process provides high throughput and low temperature (<75° C.) etching, which is compatible with conventional semiconductor processes. Dielectrophoresis-assisted growth can also be used to form metallic nanowires from an aqueous salt solution, such as silver and palladium.

Figure 5A:
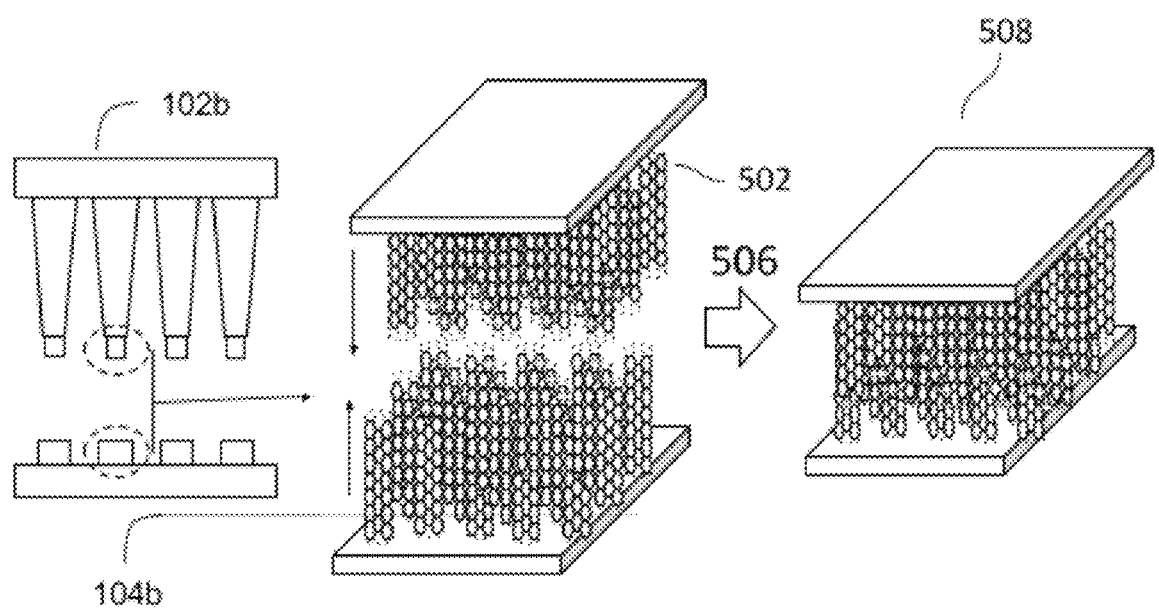
FIG. 5A shows bonding of vertically aligned CNTs/rGO NWs between pads of micro device arrays and receiving substrate.
Figure 5B:
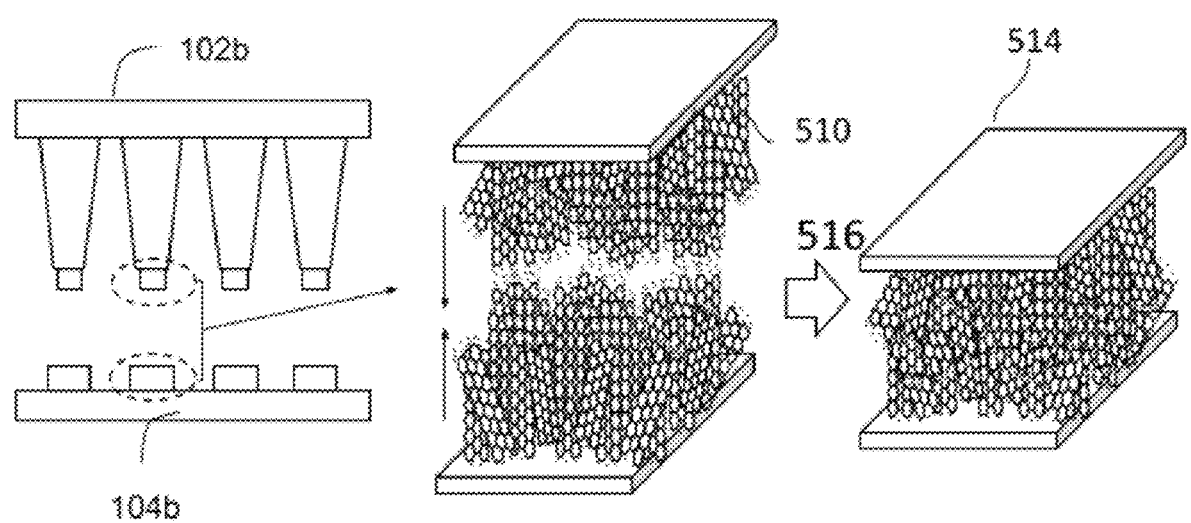
FIG. 5B shows bonding of randomly formed CNT/rGO NWs between pads of micro device arrays and receiving substrate.

FIG. 5A-5B shows bonding of vertically/randomly aligned carbon nanotubes (CNTs)/reduced graphene oxide (rGO) NWs between pads of micro device arrays 102b and receiving substrate 104b. Vertically aligned 502 (FIG. 5A) or randomly aligned 510 (FIG. 5B) highly conductive carbon-based nanomaterials such as rGO NWs and CNTs can be implemented as one-dimensional and vertical current paths for bonding 506 between pads of micro device arrays 102b and receiving substrate 104b. rGO NWs can be fabricated through chemical reduction and CNTs can be produced using CVD, laser ablation, and arc discharge methods. Vertically aligned 508 (FIG. 5A) or randomly formed nanostructures 514 (FIG. 5B) can be formed onto the substrate.

Figure 6A:
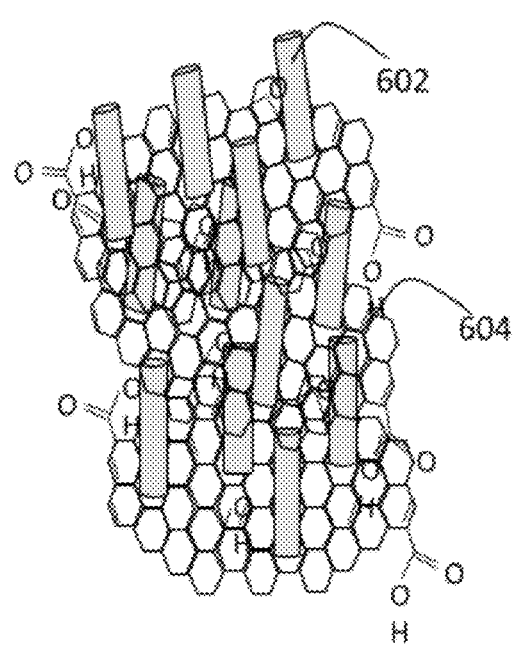
FIG. 6A shows formation of random 3D stacks of rGO sheets decorated with nanopillars/NWs.
Figure 6B:
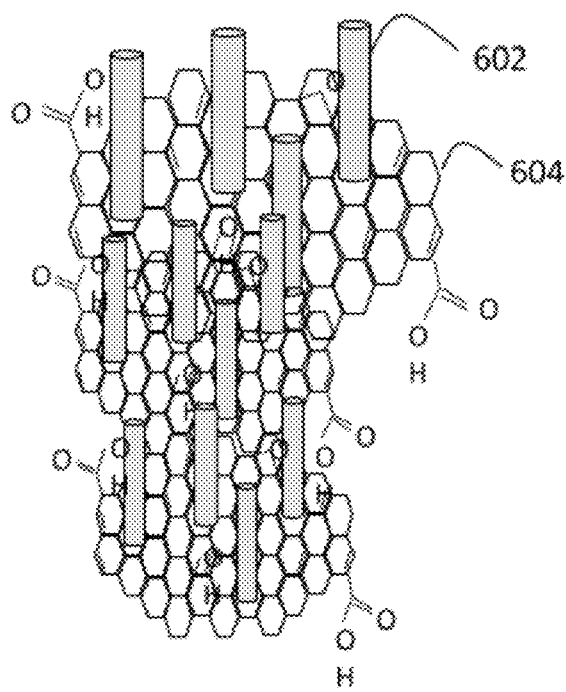
FIG. 6B shows formation of vertically aligned 3D stacks of rGO sheets decorated with nanopillars/NWs.

FIG. 6A-6B shows formation of random/vertically aligned 3D stacks of rGO sheets decorated with nanopillars/NWs. FIG. 6A shows the 3D stack of rGO sheets/foam/films 604 decorated with in-situ grown ZnO nanopillars/nanowires 602 can be realized by a direct freeze-drying and hydrothermal process. The stacks can be formed randomly (FIG. 6A) or in a vertically aligned structure (FIG. 6B).

The unique structure creates an interlocking, flexible, high performance bonding medium, which effectively reduces agglomeration of rGO while increasing the density and surface profile of the composite. A very thin layer bonding material can be deposited onto the 3D stack structure after formation to improve bonding properties. The bonding material can be In, Ag, and Sn.

Figure 6C:
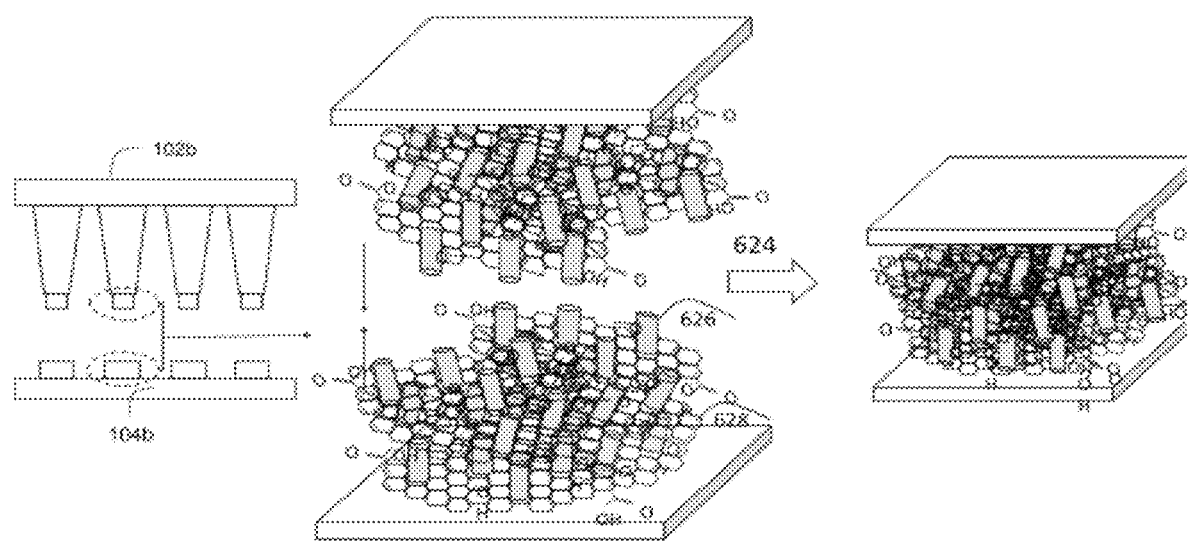
FIG. 6C shows bonding of randomly aligned 3D stacks of rGO sheets/foam/film decorated with nanopillars/NWs between pads of micro device arrays and receiving substrate.
Figure 6D:
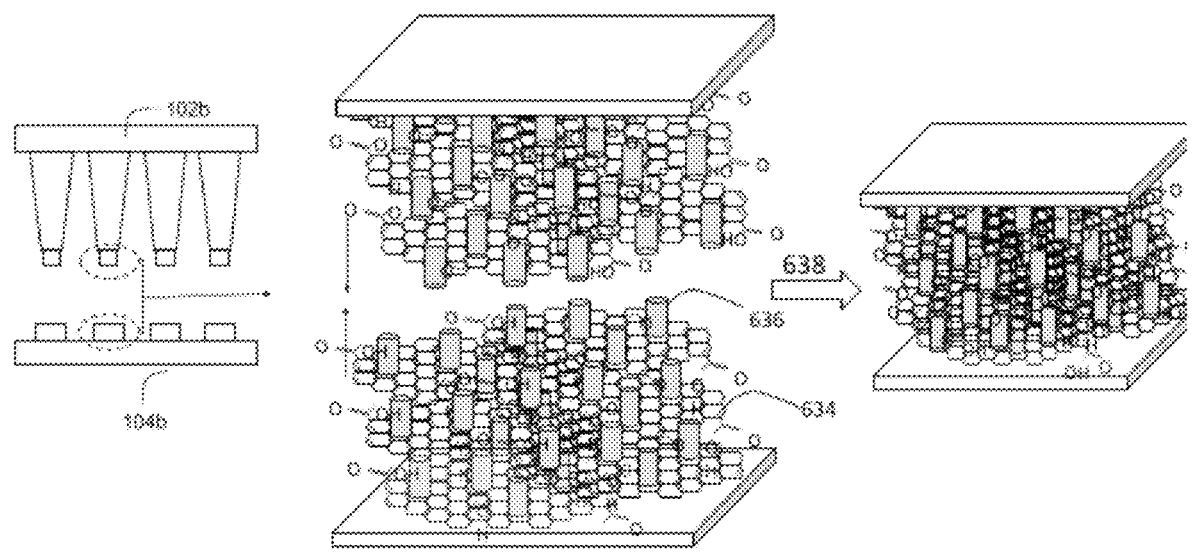
FIG. 6D shows bonding of vertically aligned 3D stacks of rGO sheets/foam/film decorated with nanopillars/NWs between pads of micro device arrays and receiving substrate.

FIG. 6C-6D shows bonding of vertically aligned/randomly aligned 3D stacks of rGO sheets/foam/film decorated with nanopillars/NWs between pads of micro device arrays and receiving substrate. FIG. 6C shows bonding 624 of random aligned 3D stacks of rGO sheets/foam/film 628 decorated with nanopillars/NWs 626 between pads of micro device arrays 102b and receiving substrate 104b. Similarly, FIG. 6D shows bonding 638 of vertically aligned 3D stacks of rGO sheets/foam/film 634 decorated with nanopillars/NWs 636 between pads of micro device arrays 102b and receiving substrate 104b.

FIG. 7A shows formation of metal nanoparticles/nanowires decorated reduced graphene oxide (rGO) 702. Metal nanoparticles/nanowires decorated rGO sheets/films/foams 704, 706 are mutually-supporting porous structures that can be prepared in situ by annealing self-assembled graphene oxide (GO) 702 coated with metallic precursors in an inert atmosphere.

Figure 7B:
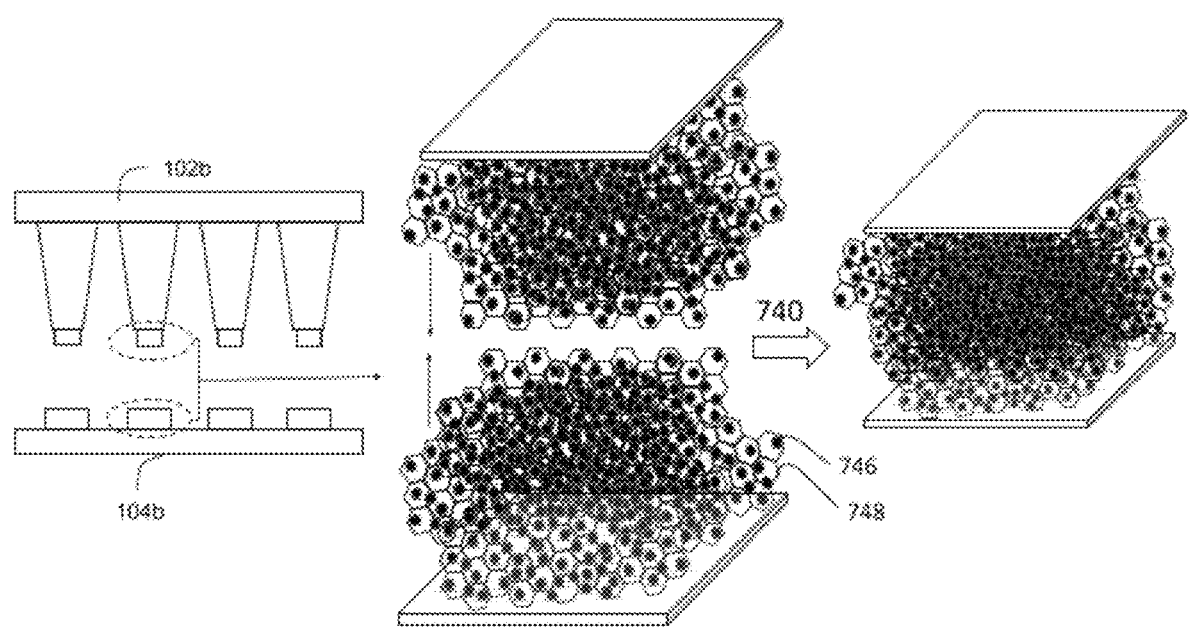
FIG. 7B shows bonding of 3D stack of metal nanoparticles (NPs) decorated on reduced graphene oxide (rGO) sheets/foam/films between pads of micro device arrays and receiving substrate.

FIG. 7B shows bonding 740 of 3D stack of metal nanoparticles (NPs) 746 decorated on reduced graphene oxide (rGO) sheets/foam/films 748 between pads of micro device arrays 102b and receiving substrate 104b. A very thin layer bonding material can be deposited onto the 3D stack structure after formation to improve bonding properties. The bonding material can be In, Ag, and Sn.

Figure 7C:
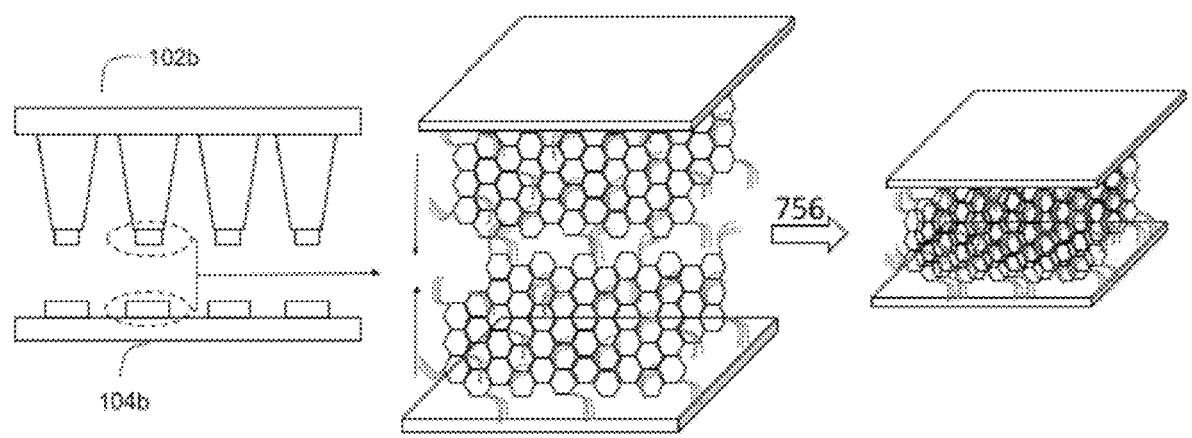
FIG. 7C shows bonding of 3D stack of silver nanoparticles/nanowires decorated reduced graphene oxide (rGO) sheets/foam/films between pads of micro device arrays and receiving substrate.

FIG. 7C shows bonding 756 of 3D stack of metal nanowires decorated on reduced graphene oxide (rGO) sheets/foam/films between pads of micro device arrays 102b and receiving substrate 104b that creates a bonding material with enhanced interlocking and surface profile. A very thin layer bonding material can be deposited onto the 3D stack structure after formation to improve bonding properties. The bonding material can be In, Ag, and Sn.

FIG. 8A shows 3D scaffold of aligned crossed metallic/TCO nanowires and nanofibers (metallic, polymer, CNTs, carbon, etc). 3D scaffolds of stand-alone nanowires and nanofibers or decorated with metal NPs are another examples of 3D nanostructures with improved interlocking properties and extremely large surface areas. They can be formed using aligned crossed metallic (e.g Ag) nanowires, 3D metallic and polymer, CNTs, and carbon nanofibers.

FIG. 8B1 shows 3D scaffold of randomly crossed metallic nanowires, CNTs, and nanofibers formed using randomly aligned crossed metallic nanowires, 3D metallic and polymer, CNTs, and carbon nanofibers. A very thin layer bonding material can be deposited onto the 3D stack structure after formation to improve bonding properties. The bonding material can be In, Ag, and Sn.

FIG. 8B2 shows 3D scaffold of randomly crossed metallic nanowires, CNTs, and nanofibers decorated with metal nanoparticles. Metallic NWs, CNTs and carbon nanofibers can be drop-cast, spin-coat, or electro-spun (electrospinning) onto the substrate, followed by chemical (or physical) deposition of metals, or chemical deposition of metal nanoparticles and decoration of nanofibers with conductive NPs. This process leads to rapidly improved conduction. Gold and silver nanostructures are synthesized by simply immersing the (carbon, polymer, DNA, etc) nanofibers (with some surface functional groups for reaction with metal precursors) into an aqueous solution of metal ion precursors. While the metal ions are locally reduced on the surface of the nanofibers, large metal nanoparticles form, and smooth carbon (or polymer)-metal hybrid nanostructures forms.

FIG. 8C shows the interlocked bonding 802 of 3D scaffold of randomly crossed nanowires/CNTs/nanofibers 806 decorated with metal nanoparticles 804 between microdevice arrays 102b and receiving substrates 104b.

FIG. 8D1-8D3 shows SEM images of bare Ag NWs (nanowires), Indium (In) coated Ag NWs and Tin (Sn) coated Ag NWs, respectively after electrical bonding by applying 400 mA constant, direct current (DC) for 80 seconds. The coating of Ag NWS with bonding material not only covers the nanowires, but also fills the gap between joints. The formation of nano-joints are apparent in the images. The bonding materials enhance the eutectic bonding to form alloys with Ag NWs and lower the thermal input required to undergo Joule-heating. Hence, an overall increase in nanojoint formation along with the associated resistance decrease are achieved.

Figure 8E:
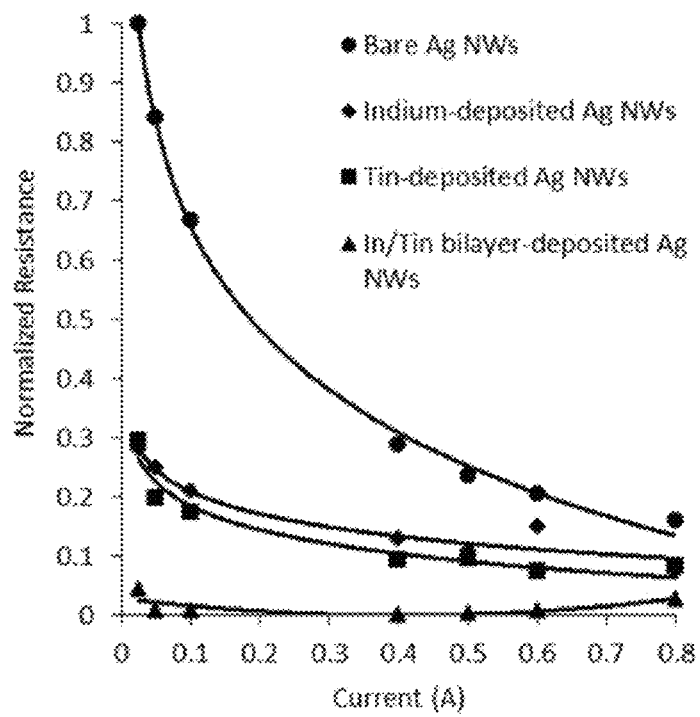
FIG. 8E shows a graphical representation of resistance vs. DC current according to an embodiment of the present invention.

FIG. 8E shows a decrease in resistance via deposition of bonding material onto Ag NWs by applying 25-800 mA DC current. In one example, the decrease in resistance was seen to be more significant at lower currents making the deposition method more suitable for low-current regime. Indium and Tin bonding materials coated on Ag NWs were both seen to have an equivalent effect on resistance, with Tin having a slightly better effect on decreasing resistance. In another example, the bilayer In/Tin coated Ag NWs showed further decrease in resistance, lowering bare NW resistance to half of its original value with lower currents. The coating of nanowires with bonding materials reinforces the nanowires interconnections to a significant degree. It also allows for more current pathways to be established upon Joule heating, due to greater contact points from the deposited metal regions, resulting in overall lower electrical resistance.

Figure 8F:
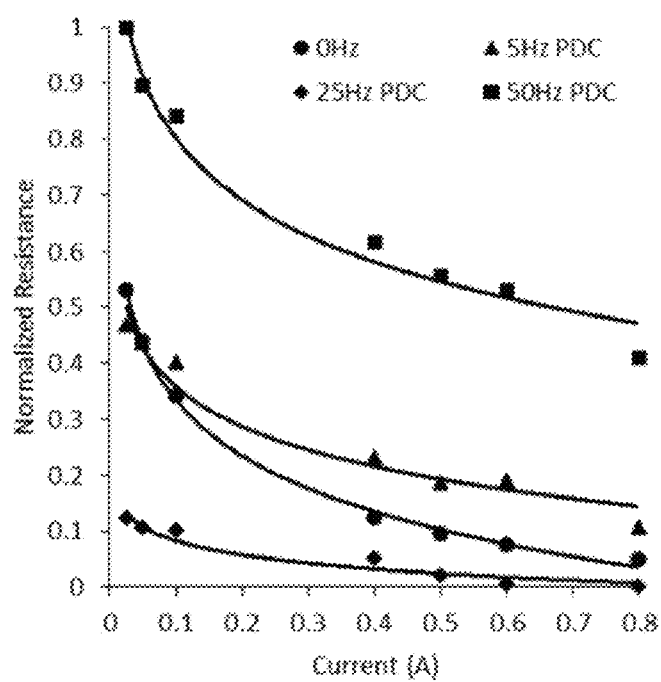
FIG. 8F shows an effect of applying pulsed direct current (PDC) on the resistance of Ag NWs and the nano joints according to an embodiment of the present invention.

FIG. 8F shows the effect of applying pulsed direct current (PDC) on the resistance of Ag NWs and the nano-joints as compared to DC current. A logarithmic decrease in resistance of Ag NWs can be observed as the magnitude of applied current is increased. Therefore, the nanojoints are formed more readily at higher applied current. In the case of applying PDC, a 25 Hz waveform, altering between "on-time" and "off-time" in one direction, showed the best decrease in resistance when compared to standard DC, which means that the "on-time" was enough to supply sufficient energy to sinter nanowires, while "off-time" allows for ease of strain without a substantial loss in the thermal response rate.

Figure 9A:
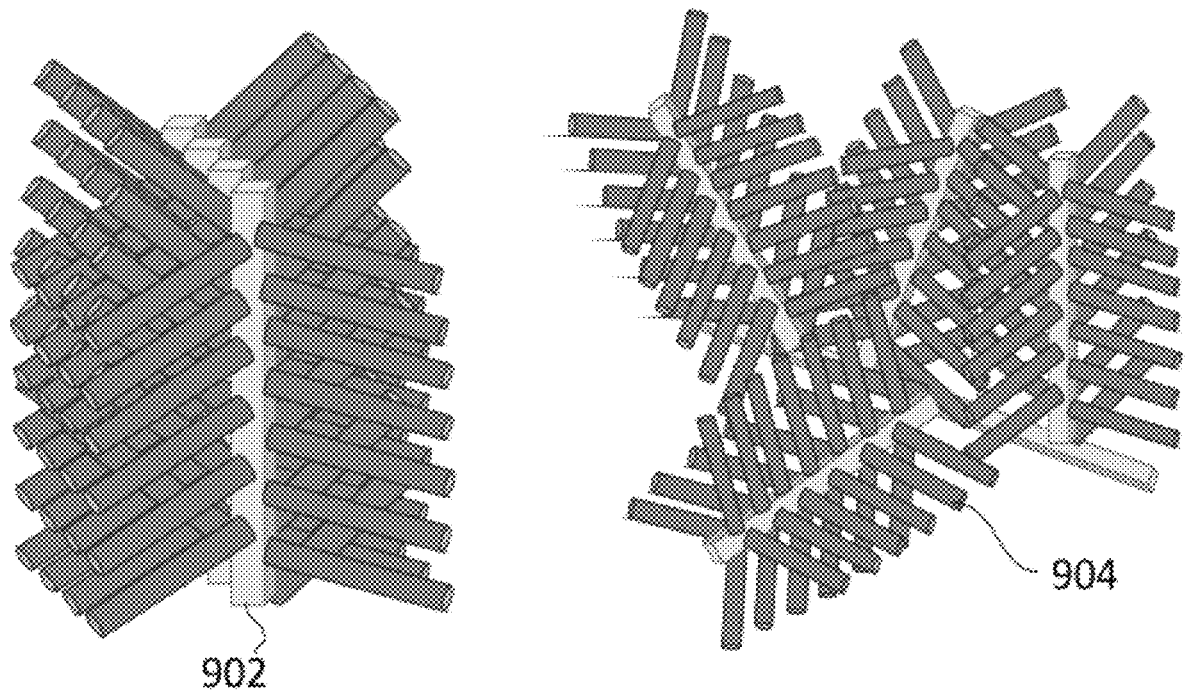
FIG. 9A shows hierarchical branch-type nanowires with improved interlocking properties.

FIG. 9A shows hierarchical branch-type nanowires with improved interlocking properties with a backbone 902 (such as $SnO_2$, ZnO) and branches 904 (such as ZnO, Ag), combining carbothermal reduction with hydrothermal or catalyst-assisted VLS growth. Branch-type nanowires with improved interlocking properties, including hierarchical can be fabricated in a process that combines carbothermal reduction with hydrothermal growth.

Figure 9B:
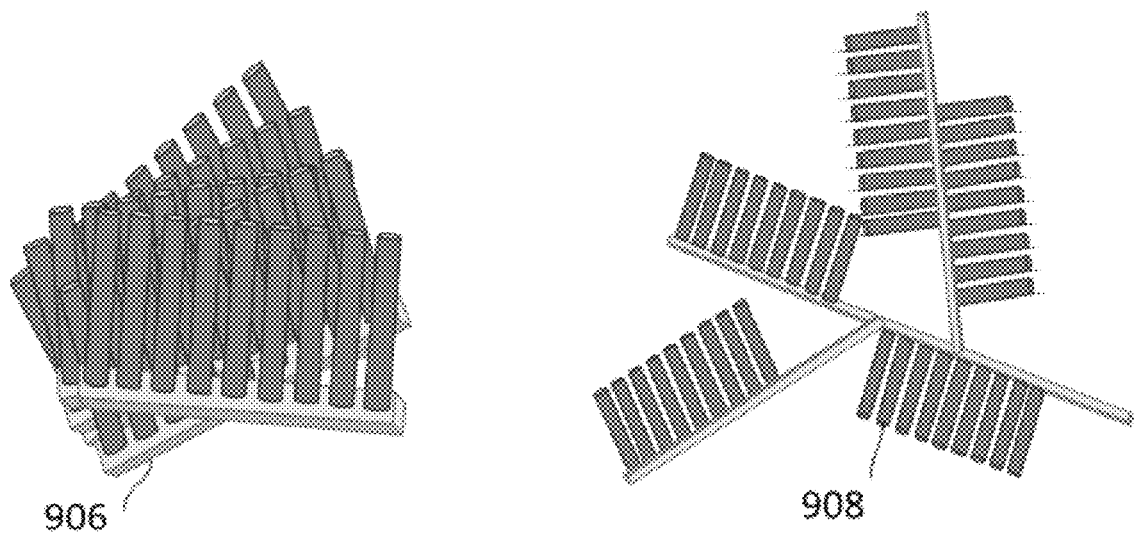
FIG. 9B shows comb-like branched-type nanowires with improved interlocking properties.

FIG. 9B shows hierarchical comb like branched-type nanowires with improved interlocking properties with a backbone 906 (such as $SnO_2$, ZnO) and branches 908 (such as ZnO, Ag). Comb-like nanostructures with a backbone (such as SnO2) and branches (such as ZnO), with improved interlocking properties, including hierarchical can be fabricated in a process that combines carbothermal reduction with hydrothermal growth.

The hybrid SnO2-ZnO or ZnO—Ag nanowires can also be produced via a two-step carbothermal reduction method at low pressure (around 1 Pa). It can also be produced using a single step carbothermal reduction based on the catalyst-assisted vapour-liquid-solid (VLS) mechanism. In this synthetic process, activated carbon powder acts as a reducing agent, while metal nanoparticles or nanoclusters serve as nucleation seeds. The metal nanoparticle seeds determine the growth direction, interfacial energy and diameter of the resultant one-dimensional metal/metal oxide nanowires. In this facile synthesis method, the morphology and properties of nanowires are mainly controlled by growth parameters such as temperature, thickness of the catalyst layer, rate of carrier gas flow, and distance between the source and the substrate. The diameter of the backbone nanowire will be in the range of few tens of nanometers (~50-100 nm) while the branched nanowires have slightly smaller diameters (~10-30 nm). Bonding materials such as silver, indium, tin, etc can be evaporated onto the as-formed branched/comb-like NW structure, covering it with a metallic layer.

FIG. 9C shows 3D scaffold of such structures with high interlocking bonding properties can be produced by stacking the aligned 912, randomly-formed hierarchical 914 and comb-like nanostructures 916.

FIG. 9D shows bonding of 3D scaffold of aligned nanostructures between micro-device arrays and receiving substrates. The resulting 3D structure can be decorated with metallic nanoparticles to further improve the surface bonding area. The bonding structures utilizing these architectures may be presented in the aligned as well as randomly-formed hierarchical and comb-like nanostructures.

These nanowires can be either directly formed onto the pads of the micro devices and/or receiving substrate, or they can be transferred to the pads and attached to the surface by deposition of thin layers and selection of adhesive materials.

Figure 10B:
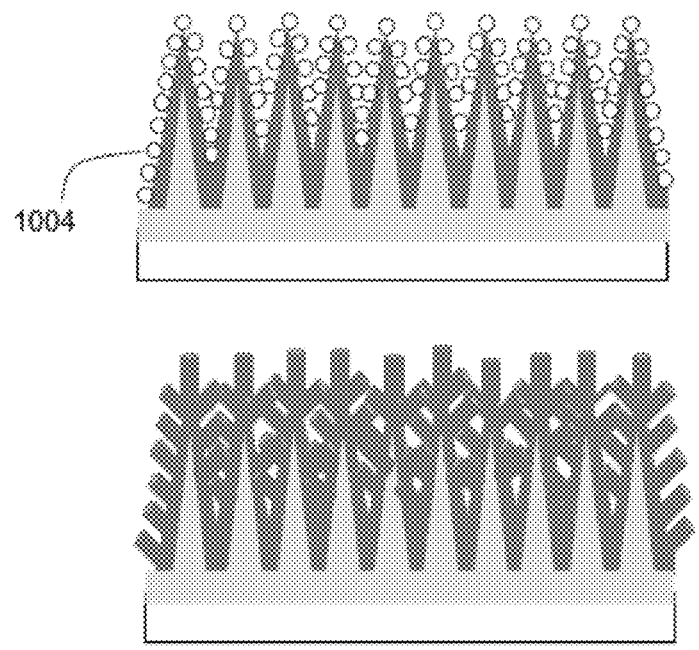
FIG. 10B shows branch-type nanowires with improved interlocking properties with nanocone backbone.

FIG. 10A-10B shows branch-type nanowires with improved interlocking properties with nanowire/nanocone. Branch-type nanowires with improved interlocking properties with a either a nanowire backbone 1002 (metal, TCO) or nanocone backbone 1004 and branches (metal, TCO) can also be formed through consecutive self-assembly of etch masks (nano hard masks, silica, polymer beads, etc) and etching (dry, wet, milling).

Figure 11:
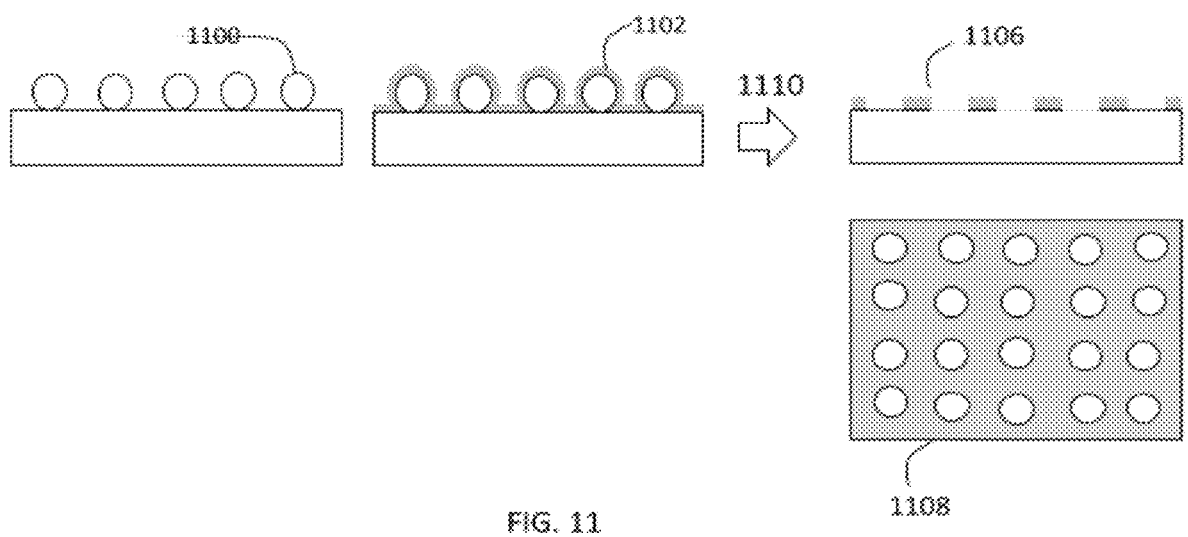
FIG. 11 shows an example of formation of metallic nanomesh using nanosphere lithography followed by bonding material (e.g metal layer) deposition and etching, forming 2D nanohole arrays.

FIG. 11 shows an example of formation of metallic nanomesh using nanosphere lithography with engineered size pitch through etching followed by bonding material (e.g metal layer) deposition, forming 2D nanohole arrays. A precisely controlled nanomesh from bonding materials 1102 (e.g. metal films) can be fabricated using nanosphere lithography 1100 to pattern bonding materials 1102 (e.g. silver, In, Sn thin films), forming 2D hexagonal nanohole arrays with excellent uniformity, high conductivity and good transparency. Silica or polymer nanospheres with appropriate surface functional groups can be assembled in monolayers via simple and scalable drop-casting, spin-coating, vertical dip coating, or Langmuir-Blodgettt Troughs methods. Next, the size of silica or polymer beads are reduced via etching 1100. Etching is performed under fluorine, mixture of fluorine-oxygen ($CF_4/O_2$), or oxygen gas (for the case of polymer beads), using moderate plasma condition for few minutes (5-10 minutes). The metal 1102 is then deposited onto the structure. Metallic nanomesh 1106 will form after lift-off 1110 of nanobeads, achieved with simple ultrasonication or chemical etching. The size and pitch of the metal nanomesh can be engineered by the initial size of the selected nanobeads and the post-etching step. A top view 1108 is also shown.

Figure 12A:
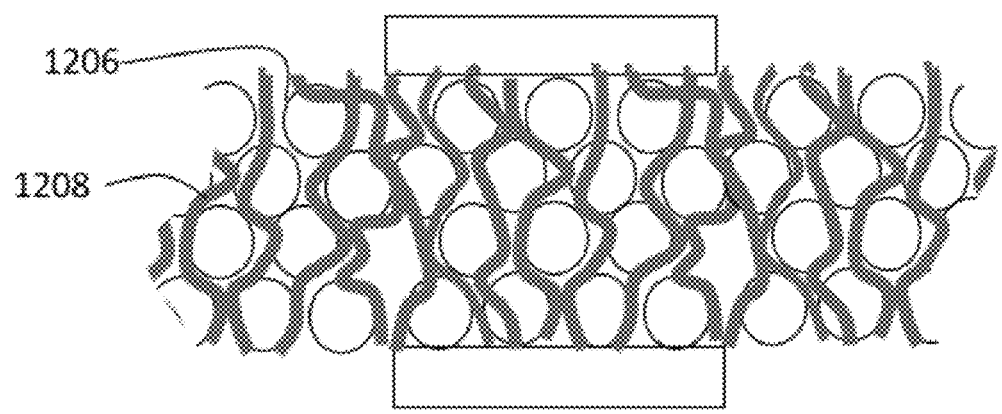
FIG. 12A shows 3D assembly of mixture of silica/polystyrene nanobeads and metal/TCO NWs/graphene nanowires/CNTs for selective bonding.

FIG. 12A shows 3D assembly of mixture of silica/polystyrene nanobeads and metal/TCO NWs/graphene nanowires/CNTs for selective bonding. 3D nanoporous metal nanostructures can be formed with silica nano-templating and subsequent electroplating. First, the metal layer 1208 is deposited on the substrate. Then, silica or polymer nanobeads 1206 with the desired size will be assembled onto the surface, forming a monolayer template. The size of the nanobeads are optimized by plasma dry etching, creating openings. Next, the metal layer electroplated onto the openings. The beads 1206 are removed in a chemical etch process that results in a 3D nanoporous metal nanostructures with improved surface area.

The combination of silica nanospheres or polystyrene nanobeads and nanostructures with one directional current path (e.g. metal/TCO NWs, graphene nanowires or CNTs, etc) can form a 3D assembly that may be advantageous for selective bonding (where cartridges with arrays of micro-LED devices are used)

Figure 12B:
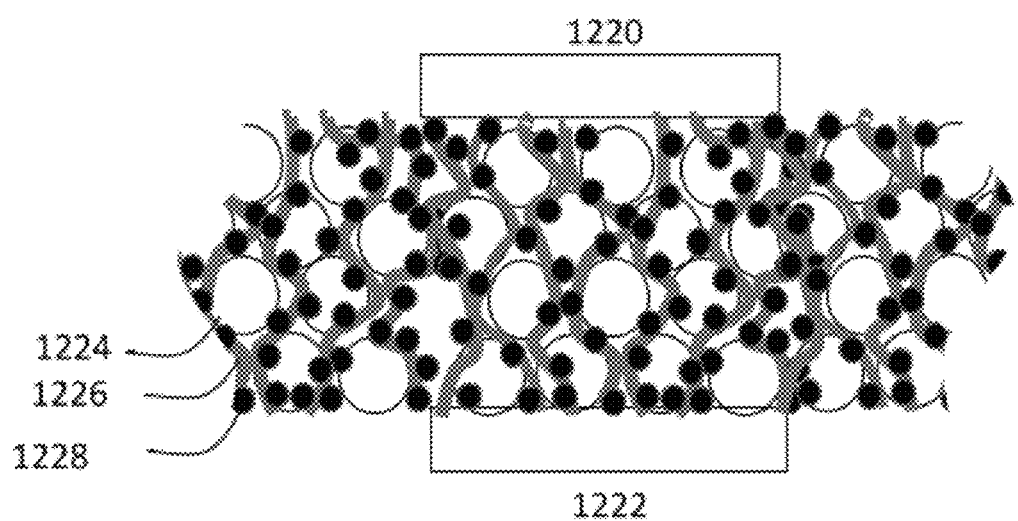
FIG. 12B shows 3D assembly of mixture of silica/polystyrene nanobeads and metal/TCO NWs/graphene nanowires/CNTs with additional metal NPs for selective bonding.

FIG. 12B shows 3D assembly of mixture of silica or polystyrene nanobeads 1224 and metal/TCO NWs, graphene nanowires or CNTs, etc) with additional metal NPs for selective bonding. That metallic nanoparticles (NPs) can be anchored onto all of the above mentioned nanostructures 1226, including the NWs, CNTs, rGO, 3D scaffolds presented here, using a layer by layer (LBL) assembly process, dip coating or drop-casting. These structures will be decorated with metallic or metal-coated silica or silica coated-metal nanofillers such as silver, silver/silica, nickel, Ag—Cu nanoparticles. The nanofillers can be grown onto the nanostructures in a CVD process, hydrothermal or carbothermal growth methods, or simple drop-casting from monodispersed metal colloidal solutions onto the as-formed nanostructures. The NP 1228 anchored nanostructures enhance surface area, producing high performance conductive adhesives. As a result, the optimum conduction between two pads (1220, 1222) and maximum bonding area will be achieved.

The silica component makes this structure mechanically resilient to bonding pressure and temperature. Metallic nanoparticles can also be added to the structure to increase the bonding surface area.

Conductive metallic nanowires/nanoparticles, graphene NWs and CNTs can be diffused into a 3D silica or polystyrene crystal by simple drop-casting. This structure can create vertical current paths for selective bonding.

Figure 13:
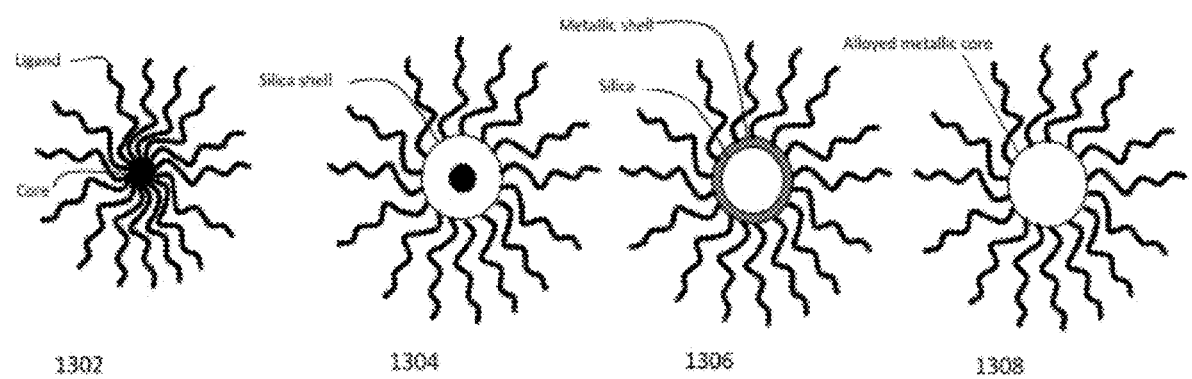
FIG. 13 shows one example of core metal/core-shell/alloyed nanoparticles.

FIG. 13 shows an example of core metal/core-shell/alloyed nanoparticles. Core metal nanoparticles 1302 such as Ag, Ni, etc, core/shell nanoparticles 1304, 1306 such as silica coated silver, metal coated siliva (Ag/silica), etc, and alloyed nanoparticles 1308 (Ag—Cu, etc) have been shown.

Figure 14:
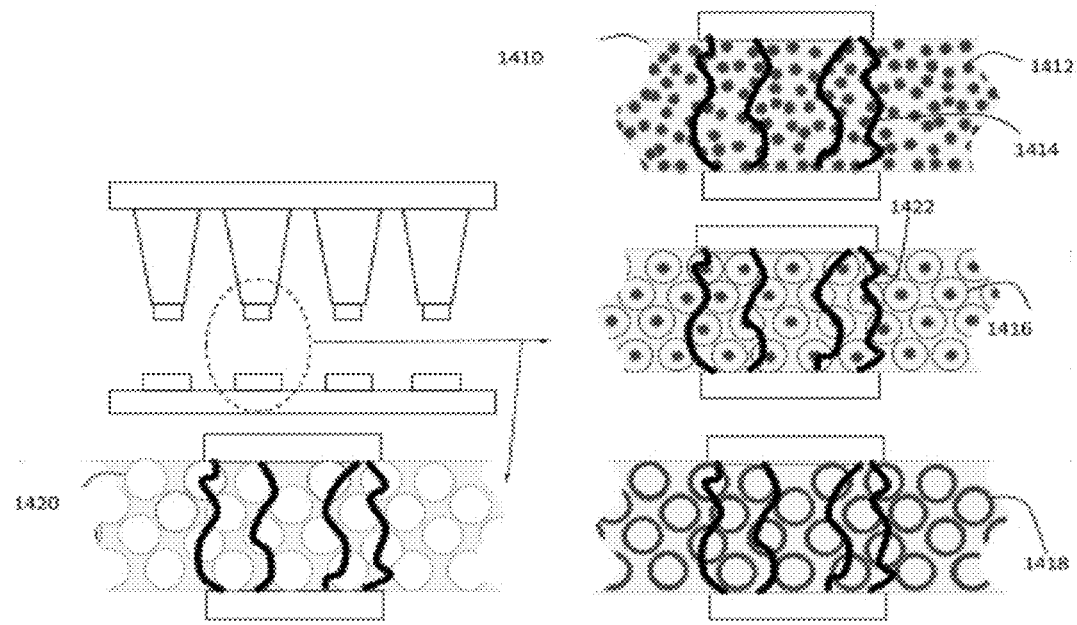
FIG. 14 shows bonding of core metal/core-shell/alloyed nanoparticles incorporated into curable host medium.

FIG. 14 shows bonding of core metal/core-shell/alloyed nanoparticles incorporated into curable host medium. Core metal nanoparticles 1412 such as Ag, Ni, etc, core/shell nanoparticles 1416, 1418 such as silica coated silver, silver coated silica (Ag/silica), etc, and alloyed nanoparticles 1420 (Ag—Cu, etc) will be incorporated into thermally and mechanically stable transparent host mediums 1410 such as polyimide, SU8, BCB, silicone, UV adhesives, and bonding epoxies. This host medium is curable using current and under light, thermal, or mechanical forces. In this approach, selection of nanoparticles with appropriate surface functional groups is critical for producing a highly conductive anisotropic layer. Ag nanoparticles with self-assembled monolayers (SAMs) of carboxyl and thiol groups enhance interface properties of the NPs and improve conduction. The pads of microdevices and the receiving substrate can also be coated with a SAM layer for better adhesion with bonding materials. The NP concentration in the medium is another key parameter that must be optimized for the minimum-close to zero lateral conduction. The directional current path are shown with black arrows 1422. Despite its simplicity, this approach is highly scalable.

Due to the physical geometry and high density of all of the above structures, they can produce an anisotropic bonding medium without being embedded in a surrounding host. They create self-standing metal nanostructures with active surfaces (catalytic properties), high conduction properties in the vertical direction, and high surface area, while showing sufficient resistance to the current or/and the pressure and temperature applied during bonding.

The structures presented in here can be covered by an overcoat layer to enhance the bonding properties.

Figure 15A:
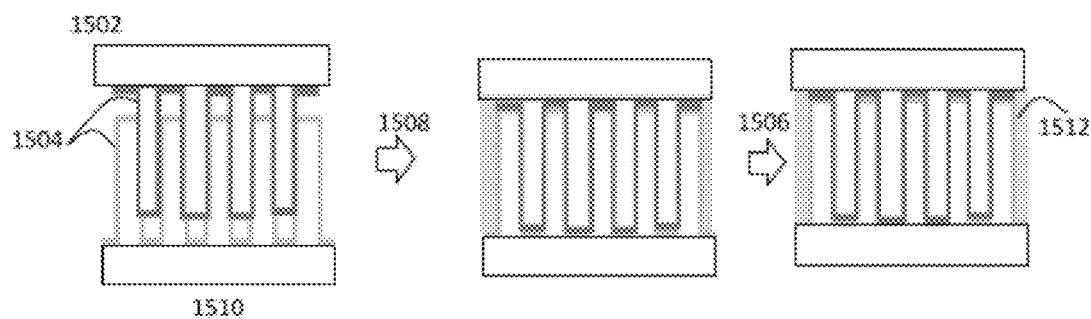
FIG. 15A shows application of curing agent in bonding of the nanostructures formed on pads of micro-device arrays and receiving substrate after alignment.
Figure 15B:
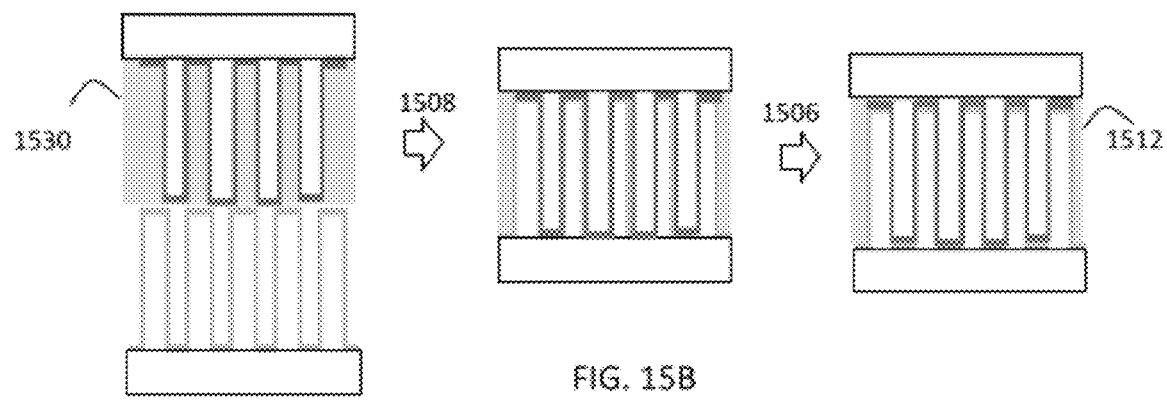
FIG. 15B shows application of curing agent in bonding of the nanostructures formed on pads of micro-device arrays and receiving substrate before alignment.

FIG. 15A-15B shows application of curing agent in bonding 1506 of the nanostructures formed on pads of micro-device arrays 1502 and receiving substrate 1510 after/before alignment. A overcoat layer 1504 can be provided for enhance bonding. To provide extra mechanical resistance during bonding, specifically for the cases where the density of the porous/textures nanostructures, NWs, CNTs and 3D scaffolds are low, the nanostructures will be embedded into a mechanically transparent, flexible and thermally stable host medium to act as a curing agent. The use of stable host mediums such as polyimide, SU8, BCB, silicone, UV adhesives, and bonding epoxies is also beneficial in cases where nanoparticles are only used as fillers (core: Ag, Ni, etc and core/shell structures: Ag/silica), or alloys Ag—Cu. The curing agent 1512 can be applied after (FIG. 15A) or before 1530 (FIG. 15B) alignment 1508 and connection of the receiver substrate and micro device.

The current, light intensity, temperature, pressure, and mechanical forces during bonding will be controlled and adjusted for different structures. These parameters will be adjusted depending on the porosity and density of the structures, ensuring the creation of anisotropic, conductive, and strong bonds.

In one embodiment, a bonding structure is provided. The bonding structure comprising two surfaces, wherein at least a part of one surface of at least one bonding pad on a receiver substrate is electrically bonded to at least a part of another surface of at least an optoelectronic microdevice on a donor substrate, wherein at least one of the two surfaces is textured to increase a surface area for bonding between the receiver substrate and the donor substrate.

In another embodiment, at least one of the two surfaces is covered by a conductive layer after texturing the at least one of the two surfaces and at least one of the two surfaces is textured by one of: an ion milling, a laser ablation, a reactive ion etching, a dry etching and a wet etching.

In yet another embodiment, at least one of the two surfaces is textured by covering at least one of the two surfaces by a plurality of nanostructures. The plurality of nanostructures comprises one of: nonconductive nanostructures, conductive nanostructures or a combination thereof. The plurality of nanostructures are one of nanotextured, nanoporous and nanopores metal nanostructures and are in a form of one of: nanoparticles, nanopillars, nanowires, nanoneedles, nanocones and silica coated nanoparticles.

In some another embodiment, the plurality of nanostructures are separated by a transparent dielectric material, wherein the dielectric material comprises one of: polyamide, SU8, PMMA, and BCB thin film layers.

In some further embodiment, the plurality of nanostructures are formed in one of: a random order or an aligned order on at least one of the two surfaces. The random order nanostructures are formed with a self-mask etching or through combining silica or polystyrene nanosphere lithography and etching and the aligned order nanostructures are formed with a controlled lithographic process or nanosphere masks.

In yet another embodiment, at least one bonding agent is deposited on at least one of the two surfaces. The at least one bonding agent fills a space between the plurality of nanostructures. The bonding agent comprises at least a material selected from the group consisting of indium, tin, and silver. A current is applied to form an eutectic bonding between the bonding agents at a low temperature.

In some another embodiment, a curing agent is applied between the two surfaces to enhance the bonding between the receiver substrate and the donor substrate. The curing agent comprises one of: polyamide, SU8, PMMA, BCB thin film layers, epoxies, and UV curable adhesives and the curing is performed in form of one of: a current, a light, a thermal, a mechanical force, or a chemical reaction.

In another embodiment, a template is formed on a space between the two surfaces to enhance the bonding between the receiver substrate and the donor substrate. The template is one of: Block-Copolymers (BCPs) and aluminum anodic oxide (AAO), a patterned etch mask, silica nanosphere, polystyrene bead. The nanotextured structures are formed by depositing the bonding agent onto the template using growth mechanism or electrochemical plating. The template is optionally removed between the two surfaces through etching process.

In some further embodiment, at least one of the two surfaces is textured by forming a 3D scaffold nanostructure on at least one of the two surfaces. The 3D scaffold nanostructures are interlocked nanostructures comprises one of: randomly crossed metallic nanowires, hierarchical branch-type/conic-like nanowires, carbon nanotubes, graphene sheets, graphene sheets decorated with nanowires/nanoparticles, 3D metallic, carbon nanofibers, and metallic mesh/clothes.

In yet another embodiment, the 3D scaffold structure is formed by depositing at least one conductive layer on the template on at least one of the two surfaces. The bonding structure further comprising adding an adhesion layer between the 3D scaffold structure and at least one of the two surfaces. A preformed 3D scaffold is transferred to at least one of the two surfaces after the adhesion layer added to the at least one of the surfaces and a preformed 3D scaffold is transferred to at least one of two surfaces and the adhesion layer is deposited after the said transfer. The adhesion layer comprises one of: soldering materials, polymers, and functional nanoparticle films.

In another embodiment, a bonding process is provided. The bonding process comprising providing two surfaces, wherein at least a part of a first surface of at least one pad on a receiver substrate is electrically bonded to at least a part of a second surface of at least an optoelectronic microdevice on a donor substrate, covering at least one of the two surfaces by a plurality of nanostructures; and filling an area between the plurality of nanostructures by a bonding agent.

In yet another embodiment, the bonding agent is a one of: a soldering material, bonding materials, polymers, and solutions filled with conductive nanoparticles. The plurality of nanostructures filled with the bonding agent is removed from a space between pads by etching for selective bonding. The two surfaces are electrically bonded through current curing to provide eutectic bonds and forming nano-joints at low temperature and the current curing is done by applying a DC pulse or an AC current to the two surfaces.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of electrically bonding a microdevice into a receiver substrate, the method comprising:
   bonding at least a part of one surface of at least one bonding pad on a receiver substrate to at least a part of another surface of at least an optoelectronic microdevice on a donor substrate,
   covering a gap between the at least one bonding pad and the at least one optoelectronic microdevice with a nanowire,
   coating the nanowire with a bonding material to decrease a resistance of the nanowire, and
   applying a current to the at least one boding pad to decrease the contact resistance.

2. The method of claim 1, wherein the nanowire coating comprises of nanoparticles.

3. The method of claim 1, wherein the nanowire coating is done by deposition of metal on the nanowire.

4. The method of claim 1, wherein the nanowire coating is In, Ag or Sn.

5. The method of claim 1, wherein the nanowire is a metal, a TOC or a carbon nanotube.

6. The method of claim 1, wherein an electrical energy is applied to the nanowire to reduce the resistivity.

7. The method of claim 6, wherein the electrical energy is applied as a pulsed voltage.

8. The method of claim 1, wherein a bonding material enhances the eutectic bonding to form alloys with Ag nano-wires and lower the thermal input required for bonding.

9. The method of claim 1, wherein the dc current is 400 mA applied constantly for 80 seconds.

10. The method of claim 1, wherein the resistance is decreased greater at lower currents within a 25-800 mA range.

11. The method of claim 1, wherein Indium and Tin bonding materials coated on the Ag nano-wires have an equivalent effect on resistance.

12. The method of claim 10, a bilayer In/Tin coated Ag nano-wires further lower bare nano-wires resistance to half of its original value with lower currents.

13. The method of claim 12, the coating of nanowires with bonding materials reinforces nanowires interconnections to a significant degree creating more current pathways after Joule heating, due to greater contact points from deposited metal regions, resulting in lower electrical resistance within the range.

14. The method of claim 1, wherein a coating of Ag nano-wires with bonding material fills a gap between nano-joints and form alloys with Ag nano-wires and lowers a thermal input required to undergo a Joule-heating.

15. The method of claim 1, wherein a pulse dc current is applied.

16. The method of claim 15, wherein there is a logarithmic decrease in resistance of Ag nano-wires as a magnitude of applied current is increased.

17. The method of claim 15, wherein a 25 Hz waveform, altering between an "on-time" and an "off-time" in one direction, results in a maximum decrease in resistance when compared to a standard DC current.

18. The method of claim 17, wherein the "on-time" supplies sufficient energy to sinter nanowires.

* * * * *